US012751188B2

(12) United States Patent
Kim et al.

(10) Patent No.: US 12,751,188 B2
(45) Date of Patent: Sep. 29, 2026

(54) LIGHT EMITTING DISPLAY DEVICE

(71) Applicant: LG Display Co., Ltd., Seoul (KR)

(72) Inventors: SeongYeong Kim, Busan (KR); Kwanghyun Choi, Seoul (KR); ChangSoo Kim, Paju-si (KR); Jieun Oh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/062,784

(22) Filed: Feb. 25, 2025

(65) Prior Publication Data

US 2025/0280717 A1 Sep. 4, 2025

(30) Foreign Application Priority Data

Feb. 29, 2024 (KR) ........................ 10-2024-0029398

(51) Int. Cl.

| | |
|---|---|
| ***G09G 3/20*** | (2006.01) |
| ***G09G 3/3233*** | (2016.01) |
| ***H10K 59/122*** | (2023.01) |
| ***H10K 59/35*** | (2023.01) |

(Continued)

(52) U.S. Cl.

CPC ......... *H10K 59/879* (2023.02); *G09G 3/2074* (2013.01); *G09G 3/3233* (2013.01); *H10K 59/122* (2023.02); *H10K 59/353* (2023.02); *G06F 3/044* (2013.01); *G09G 2300/0426* (2013.01); *G09G 2300/0465* (2013.01); *G09G 2300/0819* (2013.01); *G09G 2300/0852* (2013.01); *G09G 2310/06* (2013.01); *G09G 2310/08* (2013.01); *G09G 2320/0233* (2013.01);

(Continued)

(58) Field of Classification Search

CPC .. H10K 59/879; H10K 59/353; H10K 50/122; G09G 3/2074; G09G 3/3233; G09G 2300/0426; G09G 2300/0465; G09G 2300/0819; G09G 2300/0852; G09G 2310/06; G09G 2310/08; G09G 2320/068; G09G 2320/0233; G09G 2354/00; G09G 2358/00; G06F 3/044

See application file for complete search history.

(56) References Cited

U.S. PATENT DOCUMENTS

2020/0066816 A1* 2/2020 Zhao .................... H10K 59/124
2020/0092516 A1* 3/2020 Moon ................... G06F 1/3215
2020/0335723 A1* 10/2020 Yuan ...................... H10K 59/40

(Continued)

FOREIGN PATENT DOCUMENTS

KR 10-2022-0165958 A 12/2022

*Primary Examiner* — Michael A Faragalla

(74) *Attorney, Agent, or Firm* — Seed Intellectual Property Law Group LLP

(57) ABSTRACT

Provided is a light emitting display device. The light emitting display device includes a plurality of pixels is disposed in a display panel and each of the plurality of pixels includes a plurality of sub pixels. Each of the plurality of sub pixels includes a first light emitting diode including a first light emitting unit which extends along in a first direction; a first lens which is disposed on the first light emitting diode and refracts light from the first light emitting diode; a second light emitting diode including a second light emitting unit which extends along in a second direction which is transverse to the first direction; and a second lens which is disposed on the second light emitting diode and refracts light from the second light emitting diode.

19 Claims, 11 Drawing Sheets

(51) Int. Cl.
*H10K 59/80* (2023.01)
*G06F 3/044* (2006.01)

(52) U.S. Cl.
CPC ... *G09G 2320/068* (2013.01); *G09G 2354/00* (2013.01); *G09G 2358/00* (2013.01)

(56) References Cited

U.S. PATENT DOCUMENTS

2021/0305541 A1* 9/2021 Ahn ........................ G02B 30/29
2024/0045287 A1* 2/2024 Um ................... G02F 1/136286

* cited by examiner

LIGHT EMITTING DISPLAY DEVICE

CROSS-REFERENCE TO RELATED APPLICATIONS

This application claims the priority of Korean Patent Application No. 10-2024-0029398 filed on Feb. 29, 2024, in the Korean Intellectual Property Office, the disclosure of which is incorporated herein by reference.

BACKGROUND

Technical Field

The present disclosure relates to a light emitting display device, and more particularly, to a light emitting display device which selectively controls a viewing angle according to an orientation direction of the light emitting display device.

Description of the Related Art

An organic light emitting diode (OLED) which is a self-emitting device includes an anode electrode, a cathode electrode, and an organic compound layer formed therebetween. The organic compound layer is formed of a hole transport layer (HTL), an emission layer (EML), and an electron transport layer (ETL). When a driving voltage is applied to the anode electrode and the cathode electrode, holes which pass through the hole transport layer HTL and electrons which pass through the electron transport layer ETL move to the emission layer EML to form excitons so that the emission layer EML generates visible rays. An active matrix type light emitting display device includes an organic light emitting diode (OLED) which is a self-emitting device and is used in various ways with the advantages of a fast response speed, large emission efficiency, luminance, and viewing angle.

The light emitting display device disposes pixels each including an organic light emitting diode in a matrix and adjusts a luminance of the pixel in accordance with a gray scale level of video data.

BRIEF SUMMARY

The inventors of the present disclosure have recognized the benefit of selectively restricting the viewing angle of the light emitting display devices based on the user's needs (e.g., protection of privacy and information).

In the related art, methods of attaching a fixed viewing angle restriction film or using a structure disposed in the display panel were suggested to restrict the viewing angle of display devices. However, such methods only restrict a viewing angle in a specific position or direction.

Generally, the light emitting display device is provided to have a rectangular shape in which one of horizontal or vertical lengths is longer. At this time, an image displayed on the light emitting display device may be implemented to be appropriate horizontally or vertically for every application. Some application may be implemented to selectively change the orientation of the images according to landscape and portrait orientations of the light emitting display device for the convenience of the user. However, according to the viewing angle restricting method of the related art, the orientation of the light emitting display device is applied to only one of a horizontal direction and a vertical direction. Therefore, when the orientation of the light emitting display device is freely changed to a horizontal direction and a vertical direction according to the selection of the user, it is difficult to freely apply the restriction of the viewing angle according to the user's choice.

Various embodiments of the present disclosure address the technical problems in the related art, including those identified above. For instance, various embodiments of the present disclosure provide a light emitting display device which selectively restricts a viewing angle.

Various embodiments of the present disclosure provide a light emitting display device which selectively restricts the viewing angle even when the light emitting display device is changed to a landscape mode and a portrait mode.

Various embodiments of the present disclosure provide a light emitting display device which suppresses the degradation of an aperture ratio and improves a luminous efficiency and a device lifespan.

Technical benefits of the present disclosure are not limited to the above-mentioned benefits, and other benefits, which are not mentioned above, can be clearly understood by those skilled in the art from the following descriptions.

According to an aspect of the present disclosure, in a light emitting display device, a display panel in which a plurality of pixels is disposed, each of the plurality of pixels includes a plurality of sub pixels, each of the plurality of sub pixels includes: a first light emitting diode including a first light emitting unit which extends long in a first direction; a first lens which is disposed on the first light emitting diode and refracts light from the first light emitting diode; a second light emitting diode including a second light emitting unit which extends long in a second direction which is perpendicular to the first direction; and a second lens which is disposed on the second light emitting diode and refracts light from the second light emitting diode.

Other detailed matters of the exemplary embodiments are included in the detailed description and the drawings.

According to the present disclosure, an orientation of the light emitting display device is sensed and even when the light emitting display device is changed to a landscape mode and a portrait mode, the viewing angle of the light emitting display device may be freely restricted according to the user's choice.

According to the present disclosure, the viewing angle may be restricted while suppressing the degradation of the aperture ratio by means of a first light emitting unit and a first lens which extend long in the first direction and a second light emitting unit and a second lens which extend long in the second direction.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
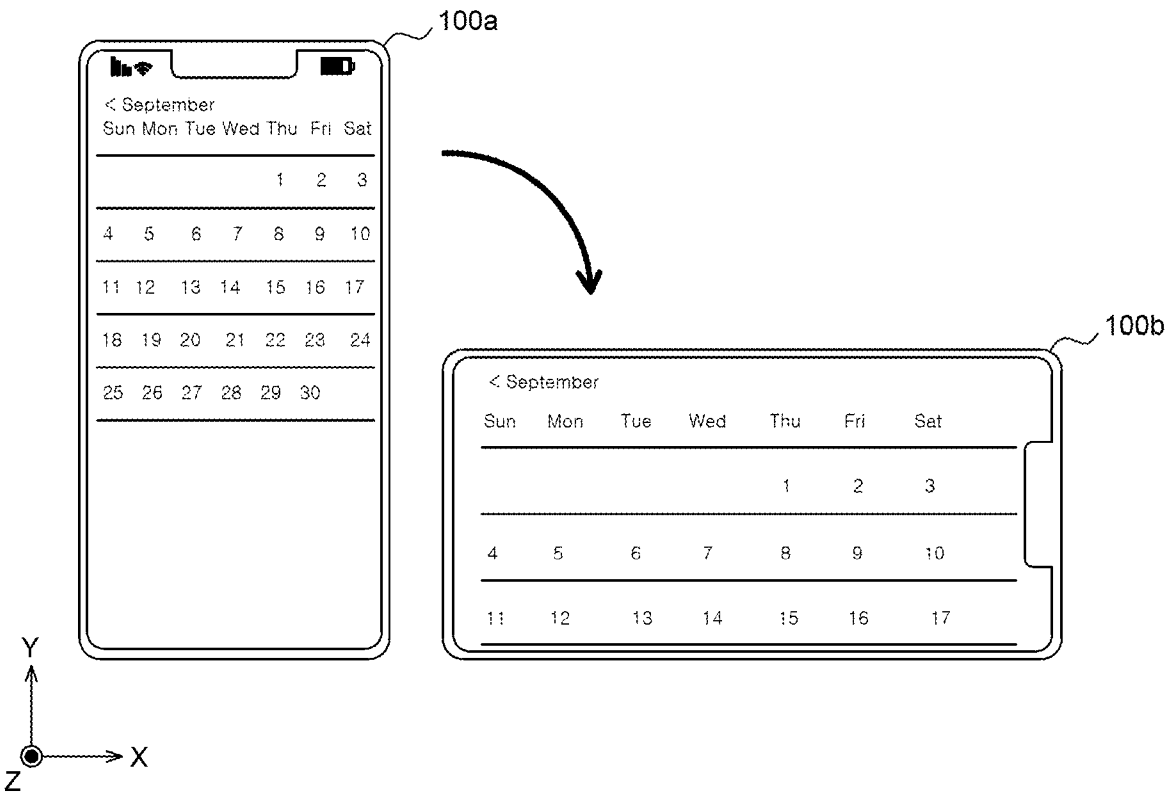
FIG. 1 is a schematic view for explaining a portrait mode and a landscape mode of a light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, numbers, and the like illustrated in the accompanying drawings for describing the exemplary embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting display device according to exemplary embodiments of the present disclosure will be described in detail with reference to accompanying drawings.

FIG. 1 is a schematic view for explaining a portrait mode and a landscape mode of a light emitting display device according to an exemplary embodiment of the present disclosure.

A light emitting display device according to an exemplary embodiment of the present disclosure may be disposed in a portrait mode 100*a* and a landscape mode 100*b* according to a user's choice.

The portrait mode 100*a* is a mode in which the light emitting display device is disposed long in a vertical direction (for example, a Y-axis direction). Also, the landscape mode 100*b* may be a mode in which the light emitting display device is disposed long in the horizontal direction (for example, an X-axis direction).

The light emitting display device according to the exemplary embodiment of the present disclosure may display a fixed image according to the portrait mode and the landscape mode. Further, as the user rotates the light emitting display device, the light emitting display device may change and display the image in a layout according to the portrait mode 100*a* and the landscape mode 100*b*. For example, as illustrated in FIG. 1, when the portrait mode 100*a* is changed to the landscape mode 100*b*, an image to be displayed rotates in a horizontal direction to be enlarged.

Figure 2:
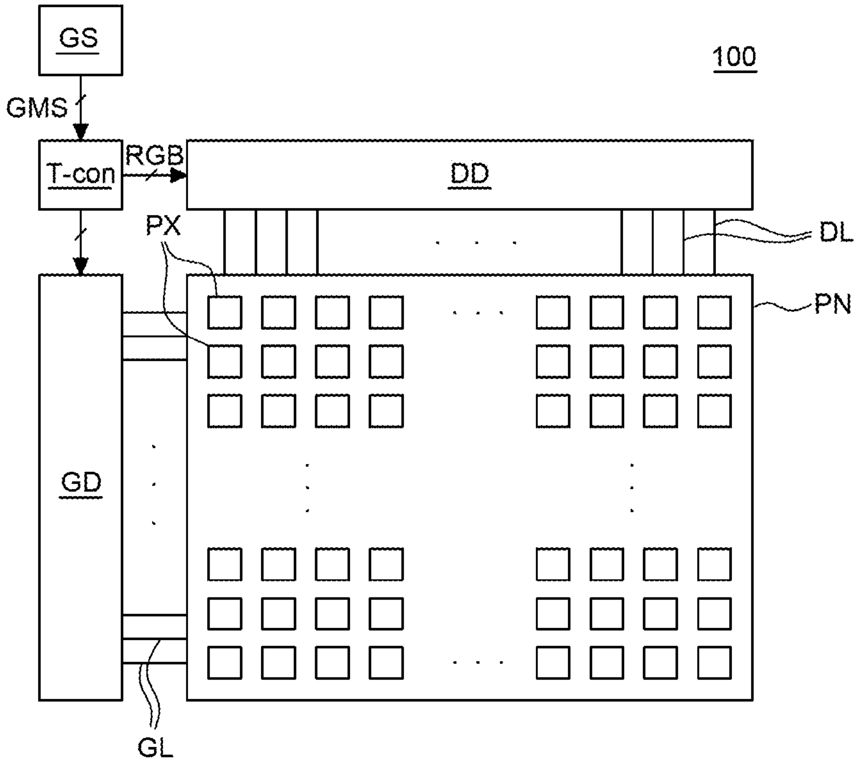
FIG. 2 is a functional block diagram of a display device according to an exemplary embodiment of the present disclosure.

FIG. 2 is a functional block diagram of a light emitting display device 100 according to an exemplary embodiment of the present disclosure.

Referring to FIG. 2, the light emitting display device 100 may include a display panel PN, a data driving circuit DD, a gate driving circuit GD, a timing controller T-con, and a gyroscope sensor GS.

The display panel PN may generate images to be provided to the user. For example, the display panel PN may generate and display images to be provided to the user through a plurality of pixels PX in which the pixel circuits are disposed.

The data driving circuit DD, the gate driving circuit GD, and the timing controller T-con may provide signals for operations of the pixels PX through signal lines. For example, signal lines for supplying a signal for operation of each pixel PX may include data lines DL and gate lines GL.

The gyroscope sensor GS is a sensor which senses an orientation direction of the light emitting display device 100. The gyroscope sensor GS detects an orientation direction of the light emitting display device 100 and may supply a corresponding signal to the timing controller T-con. For example, the gyroscope sensor GS may supply an orientation signal GMS which controls the display panel PN to a portrait mode or a landscape mode to the timing controller T-con according to the orientation direction of the light emitting display device 100.

In some cases, the light emitting display device 100 may further include a power unit. In this case, a signal for an operation of the pixel PX may be supplied through the power line which connects the power unit and the display panel PN. According to the exemplary embodiment, the power unit may supply a power to the data driving circuit DD and the gate driving circuit GD. The data driving circuit DD and the gate driving circuit GD may be driven based on the power supplied from the power unit.

For example, the data driving circuit DD applies a data signal to each pixel PX through the data lines DL. The gate driving circuit GD applies a gate signal to each pixel PX through the gate lines GL. The power unit may supply a power voltage to each pixel PX through the power voltage supply lines.

The timing controller T-con may control the data driving circuit DD and the gate driving circuit GD. For example, the timing controller T-con redisposes digital video data input from the outside in accordance with a resolution of the display panel PN to supply the digital video data to the data driving circuit DD. In the meantime, the timing controller T-con may adjust an emission signal which is applied to the pixel circuit of the display panel PN based on an orientation signal GMS transmitted from the gyroscopic sensor GS. The control of the wide field-of-view mode or the narrow field-of-view mode according to the portrait mode or the landscape mode of the light emitting display device 100 will be described below in detail.

The data driving circuit DD converts digital video data input from the timing controller T-con into an analog data voltage based on the data control signal to supply the converted analog data voltage to the plurality of data lines.

The gate driving circuit GD may generate a scan signal and an emission signal (or an emission control signal) based on the gate control signal. The gate driving circuit GD may include a scan driver and an emission signal driver. The scan driver generates a scan signal in a row sequential manner to drive at least one or more scan line connected to each pixel row to supply the scan signal to the scan lines. The emission signal driver generates an emission signal in a row sequential manner to drive at least one emission signal line connected to each pixel row to supply the emission signal to the emission signal lines.

According to the exemplary embodiment, the gate driving circuit GD may be disposed in the display panel PN in a gate-driver in panel (GIP) manner. For example, the gate driving circuit GD is divided into a plurality of circuits to be disposed on at least two side surfaces of the display panel PN.

The display panel PN may include an active area and a non-active area which encloses the active area.

The active area of the display panel PN may include a plurality of pixels PX disposed in a row direction and a column direction. For example, the plurality of pixels PX may be disposed in an area where the plurality of data lines DL and the plurality of gate lines GL intersect.

One pixel PX may include a plurality of sub pixels which emits different color light. For example, one pixel PX uses three sub pixels to implement blue, red, and green. However, this is not limited thereto and in some cases, the pixel PX may further include a sub pixel for further implementing a specific color (for example, white).

In the pixel PX, an area which implements blue may be referred to as a blue sub pixel, an area which implements red may be referred to as a red sub pixel, and an area which implements green may be referred to as a green sub pixel.

Each of the plurality of sub pixels may include a first light emitting diode and a second light emitting diode which emit the same color light.

Further, each of the plurality of sub pixels may include a first lens and a second lens which refract light from the first light emitting diode and the second light emitting diode to a specific direction to provide different viewing angles according to the portrait mode and the landscape mode of the light emitting display device. For example, the first lens corresponding to the first light emitting diode may restrict the viewing angle in the horizontal direction in the landscape mode of the light emitting display device. The second lens corresponding to the second light emitting diode may restrict the viewing angle in the horizontal direction in the portrait mode of the light emitting display device. In the meantime, the lens used in the present disclosure is used for the convenience of description and may be defined as an optical member, instead of the lens.

The non-active area may be disposed along the circumference of the active area. Various components for driving the pixel circuit disposed in the pixel PX may be disposed in the non-active area. For example, at least a part of the gate driving circuit GD may be disposed in the non-active area. The non-active area may be referred to as a bezel area.

Figure 3:
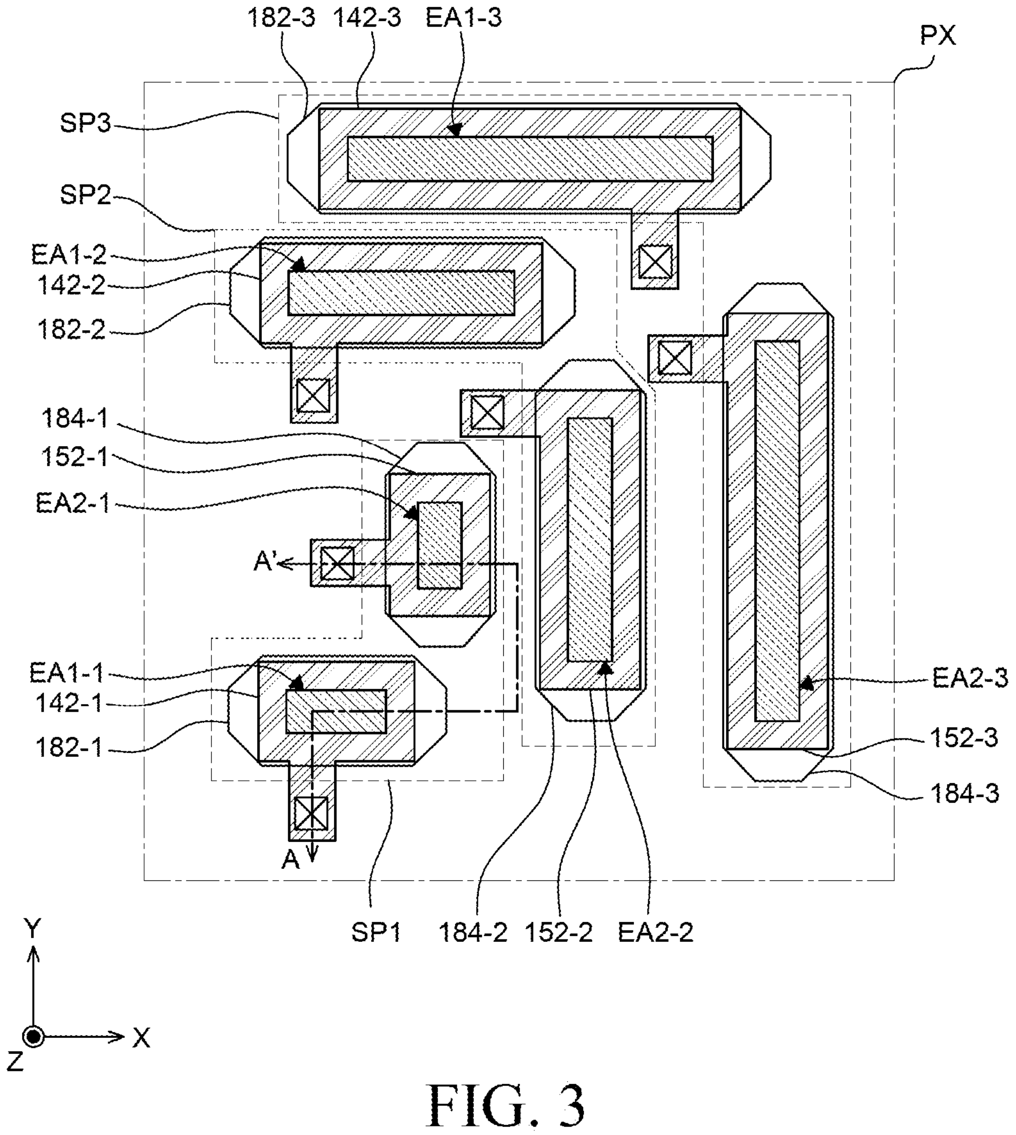
FIG. 3 is a plan view illustrating a pixel of a light emitting display device according to an exemplary embodiment of the present disclosure.

FIG. 3 is a plan view illustrating a pixel of a light emitting display device according to an exemplary embodiment of the present disclosure.

In FIG. 3, only first anode electrodes 142-1, 142-2, and 142-3, second anode electrodes 152-1, 152-2, and 152-3, first light emitting units EA1-1, EA1-2, and EA1-3, second light emitting units EA2-1, EA2-2, and EA2-3, first lenses 182-1, 182-2, and 182-3, and second lenses 184-1, 184-2, and 184-3 in each of the first to third sub pixels SP1, SP2, and SP3 of the pixel PX of the light emitting display device 100 are illustrated.

As illustrated in FIG. 3, the pixel of the light emitting display device according to the exemplary embodiment of the present disclosure includes first to third sub pixels SP1, SP2, and SP3. The first sub pixel SP1 may be a red sub pixel, the second sub pixel SP2 may be a green sub pixel, and the third sub pixel SP3 may be a blue sub pixel.

Each of the first to third sub pixels SP1, SP2, and SP3 may have a polygonal shape. At this time, the first to third sub pixels SP1, SP2, and SP3 may have different shapes. However, the present disclosure is not limited thereto and the first to third sub pixels SP1, SP2, and SP3 may have various shapes.

The first to third sub pixels SP1, SP2, and SP3 may have different areas. The areas of the first to third sub pixels SP1, SP2, and SP3 may be determined in consideration of a lifespan and a luminous efficiency of the light emitting diode provided in each sub pixel. At this time, a lifespan of the red light emitting diode is the longest. Accordingly, in order to make constant lifespan, an area of the first sub pixel SP1 is smaller than areas of the second sub pixel SP2 and the third sub pixel SP3. However, the present disclosure is not limited thereto and a ratio of areas the first to third sub pixels SP1, SP2, and SP3 may vary. In the meantime, in the present disclosure, an area of the sub pixel may refer to an emission area of each sub pixel. The emission area may be defined as an opening formed on the bank layer in each sub pixel. For example, an emission area of the first sub pixel SP1 may be areas of a first opening and a second opening which define emission areas of a first light emitting unit EA1-1 and a second light emitting unit EA2-1 in the first sub pixel SP1.

The first to third sub pixels SP1, SP2, and SP3 include first light emitting units EA1-1, EA1-2, and EA1-3 and second light emitting units EA2-1, EA2-2, and EA2-3 which restrict viewing angles in different directions, respectively. Specifically, the first light emitting units EA1-1, EA1-2, and EA1-3 and the second light emitting units EA2-1, EA2-2, and EA2-3 of the first to third sub pixels SP1, SP2, and SP3 may selectively emit light. The first light emitting units EA1-1, EA1-2, and EA1-3 and the second light emitting units EA2-1, EA2-2, and EA2-3 may restrict the viewing angle according to the orientation direction of the light emitting display device. In the present disclosure, the first light emitting units EA1-1, EA1-2, and EA1-3 and the second light emitting units EA2-1, EA2-2, and EA2-3 may be defined as openings of a bank layer which defines the emission area. For example, the first light emitting unit EA1-1 of the first sub pixel SP1 is a first light emitting diode which is exposed by a first opening formed in the bank layer in the first sub pixel SP1. The second light emitting unit EA2-1 may be a second light emitting diode which is exposed by a second opening formed in the bank layer in the first sub pixel SP1.

The first light emitting units EA1-1, EA1-2, and EA1-3 extend long in the horizontal direction (X-axis direction) and the second light emitting units EA2-1, EA2-2, and EA2-3 extend long in the vertical direction (Y-axis direction). The first light emitting units EA1-1, EA1-2, and EA1-3 may restrict a left-right viewing angle of the user when the light emitting display device 100 is in the landscape mode. Also, the second light emitting units EA2-1, EA2-2, and EA2-3 may restrict a left-right viewing angle of the user when the light emitting display device 100 is in the portrait mode.

Referring to FIG. 3, the first sub pixel SP1 includes a first light emitting unit EA1-1 extending long in the horizontal direction (X-axis direction) and a second light emitting unit EA2-1 extending long in the vertical direction (Y-axis direction). Further, the first sub pixel SP1 includes a first anode electrode 142-1 provided in the first light emitting unit EA1-1 and a second anode electrode 152-1 provided in the second light emitting unit EA2-1. The first anode electrode 142-1 provided in the first sub pixel SP1 is connected to the first thin film transistor Tr1 described below through a first drain contact hole. Further, the second anode electrode 152-1 provided in the first sub pixel SP1 is connected to the second thin film transistor Tr2 described below through a second drain contact hole.

Further, the second sub pixel SP2 also includes a first light emitting unit EA1-2 extending long in the horizontal direction (X-axis direction) and a second light emitting unit EA2-2 extending long in the vertical direction (Y-axis direction). Further, the second sub pixel SP2 includes a first anode electrode 142-2 provided in the first light emitting unit EA1-2 and a second anode electrode 152-2 provided in the second light emitting unit EA2-2. The first anode electrode 142-2 provided in the second sub pixel SP2 is connected to the first thin film transistor Tr1 described below through a first drain contact hole. Further, the second anode electrode 152-2 provided in the second sub pixel SP2 is connected to the second thin film transistor Tr2 described below through a second drain contact hole.

Further, the third sub pixel SP3 also includes a first light emitting unit EA1-3 extending long in the horizontal direction (X-axis direction) and a second light emitting unit EA2-3 extending long in the vertical direction (Y-axis direction). Further, the third sub pixel SP3 includes a first anode electrode 142-3 provided in the first light emitting unit EA1-3 and a second anode electrode 152-3 provided in the second light emitting unit EA2-3. The first anode electrode 142-3 provided in the third sub pixel SP3 is connected to the first thin film transistor Tr1 described below through a first drain contact hole. Further, the second anode electrode 152-3 provided in the third sub pixel SP3 is connected to the second thin film transistor Tr2 described below through a second drain contact hole.

In each of the first to third sub pixels SP1, SP2, and SP3, at least one first opening is provided on the first anode electrodes 142-1, 142-2, and 142-3. Further, in each of the first to third sub pixels SP1, SP2, and SP3, at least one second opening is provided on the second anode electrodes 152-1, 152-2, and 152-3. With respect to the X-Y plan view, each of the first openings has a rectangular shape in which a length in the X-axis direction is longer than a length in the Y-axis direction. Also, the second opening has a rectangular shape in which a length in the Y-axis direction is longer than a length in the X-axis direction. Further, the area of each of the second openings may be equal to an area of at least one first opening.

Half-cylindrical first lenses 182-1, 182-2, and 182-3 are disposed so as to correspond to the first light emitting units EA1-1, EA1-2, and EA1-3. Also, half-cylindrical second lenses 184-1, 184-2, and 184-3 are disposed so as to correspond to the second light emitting units EA2-1, EA2-2, and EA2-3.

At this time, each of the first lenses 182-1, 182-2, and 182-3 is disposed so as to cover each of the first openings. With respect to the X-Y planar surface, an area of each of the first lenses 182-1, 182-2, and 182-3 may be larger than an area of each of the first openings. Further, each of the second lenses 184-1, 184-2, and 184-3 is disposed so as to cover each of the second openings. With respect to the X-Y planar surface, an area of each of the second lenses 184-1, 184-2, and 184-3 is larger than an area of each of the second openings.

Specifically, in the first sub pixel SP1, one first lens 182-1 may be disposed so as to cover one first opening of the first light emitting unit EA1-1. Also, one second lens 184-1 may be disposed so as to cover one second opening of the second light emitting unit EA2-1. Further, in the second sub pixel SP2, one first lens 182-2 may be disposed so as to cover one first opening of the first light emitting unit EA1-2. Also, one second lens 184-2 may be disposed so as to cover one second opening of the second light emitting unit EA2-2. Further, in the third sub pixel SP3, one first lens 182-3 may be disposed so as to cover one first opening of the first light emitting unit EA1-3. Also, one second lens 184-3 may be disposed so as to cover one second opening of the second light emitting unit EA2-3.

Figure 4:
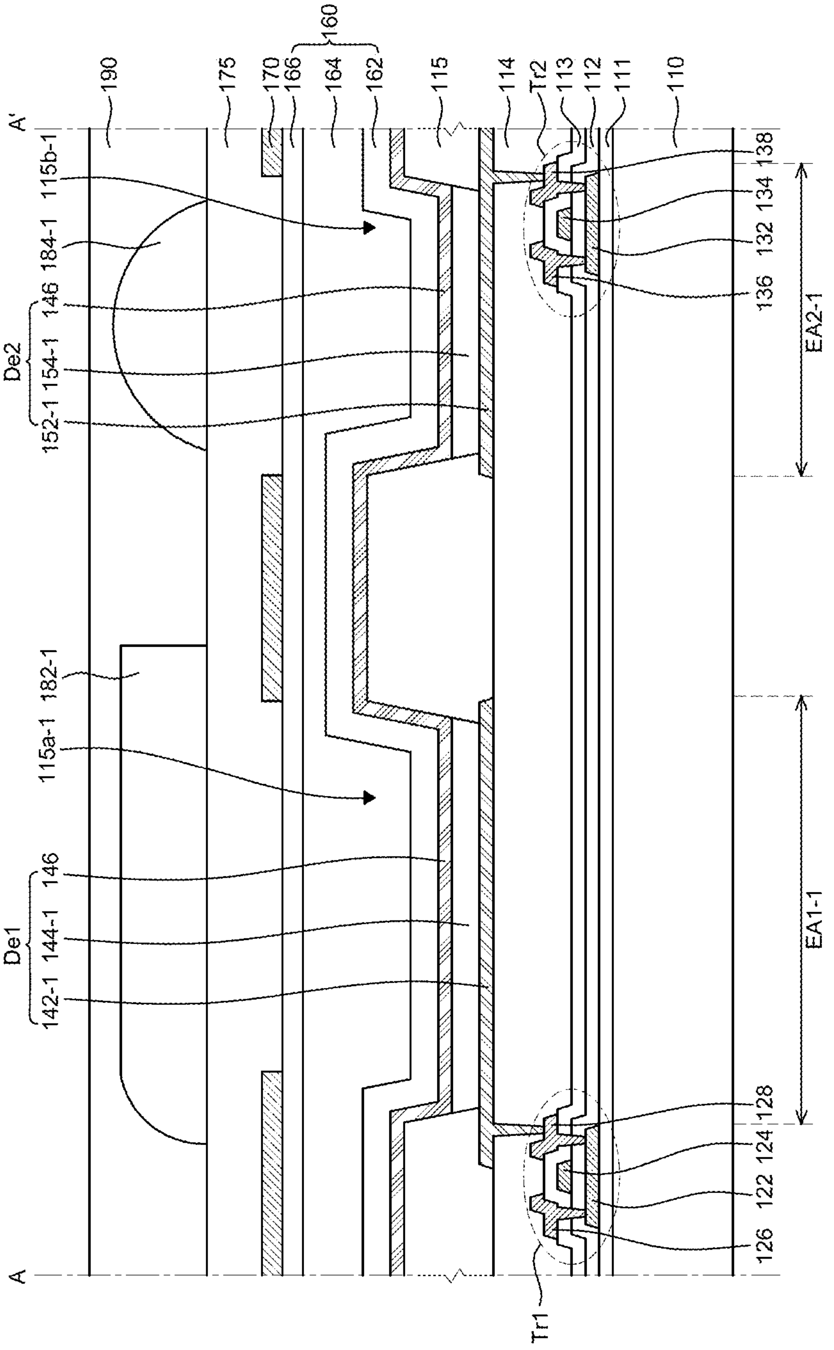
FIG. 4 is a cross-sectional view taken along A-A' of FIG. 3.

Hereinafter, the structure of the light emitting display device 100 according to the exemplary embodiment of the present disclosure will be described in detail with reference to FIG. 4 together. FIG. 4 is a cross-sectional view taken along A-A' of FIG. 3. FIG. 4 is a cross-sectional view for a first light emitting unit EA1-1 and the second light emitting unit EA2-1 of the first sub pixel SP1.

In the meantime, in FIG. 4, only a cross-sectional view of the first sub pixel SP1 is illustrated. However, the second sub pixel SP2 and the third sub pixel SP3 may have the same structure as the first sub pixel SP1 except that the first light emitting units EA1-2 and EA1-3, the second light emitting units EA2-2 and EA2-3, the first anode electrodes 142-2 and 142-3, the second anode electrodes 152-2 and 152-3, the first lenses 182-2 and 182-3, and the second lenses 184-2 and 184-3 have different sizes and the first anode electrodes 142-2 and 142-3 and the second anode electrodes 152-2 and 152-3 are connected to the pixel circuit disposed in the corresponding sub pixel.

Referring to FIG. 4, the light emitting display device 100 according to the exemplary embodiment of the present disclosure may include a substrate 110, a buffer layer 111, a gate insulating layer 112, an interlayer insulating layer 113, a planarization layer 114, a bank layer 115, a first thin film transistor Tr1, a second thin film transistor Tr2, a first light emitting diode De1, a second light emitting diode De2, an encapsulation member 160, a light shielding pattern 170, an optical gap layer 175, a first lens 182-1, a second lens 184-1, and a lens protection layer 190.

The substrate 110 may include an insulating material. The substrate 110 may include a transparent material. For example, the substrate 110 may include glass or plastic.

First to third sub pixels SP1, SP2, and SP3 are defined on the substrate 110. For example, on the substrate 110, a first sub pixel SP1, a second sub pixel SP2, and a third sub pixel SP3 are defined. Each of the first sub pixel SP1, the second sub pixel SP2, and the third sub pixel SP3 has first light emitting units EA1-1, EA1-2, and EA1-3 and second light emitting units EA2-1, EA2-2, and EA2-3.

The buffer layer 111 is disposed above the substrate 110. The buffer layer 111 is substantially located on the entire surface of the substrate 110. The buffer layer 111 blocks the moisture or foreign materials from being introduced into the thin film transistors Tr1 and Tr2 from the substrate 110. The buffer layer 111 is formed of an inorganic material, such as silicon oxide $SiO_x$ or silicon nitride $SiN_x$, and may be formed of a single layer or a plurality of layers.

The first thin film transistor Tr1 and the second thin film transistor Tr2 may be disposed on the first light emitting unit EA1-1 and the second light emitting unit EA1-2 above the buffer layer 111.

The first thin film transistor Tr1 may include a first semiconductor layer 122, a first gate electrode 124, a first source electrode 126, and a first drain electrode 128. The second thin film transistor Tr2 may include a second semiconductor layer 132, a second gate electrode 134, a second source electrode 136, and a second drain electrode 138. The second semiconductor layer 132 is located on the same layer as the first semiconductor layer 122, the second gate electrode 134 is located on the same layer as the first gate electrode 124. Also, the second source electrode 136 and the second drain electrode 138 are located on the same layer as the first source electrode 126 and the first drain electrode 128, but is not limited thereto.

A first semiconductor layer 122 and a second semiconductor layer 132 which are patterned are formed in the first light emitting unit EA1-1 and the second light emitting unit EA2-1 above the buffer layer 111. The first semiconductor layer 122 and the second semiconductor layer 132 may be independently formed of an oxide semiconductor material or polycrystalline silicon.

When the first semiconductor layer 122 and the second semiconductor layer 132 are formed of an oxide semiconductor material, a shield pattern may be further formed therebelow. A shield pattern blocks light incident onto the first semiconductor layer 122 and the second semiconductor layer 132 to suppress the degradation of the first semiconductor layer 122 and the second semiconductor layer 132 due to the light.

In contrast, when the first semiconductor layer 122 and the second semiconductor layer 132 are formed of polycrystalline silicon, impurities may be doped on both edges of each of the first semiconductor layer 122 and the second semiconductor layer 132.

A gate insulating layer 112 which is formed of an insulating material is disposed above the first semiconductor layer 122 and the second semiconductor layer 132. In FIG. 4, even though it is illustrated that the gate insulating layer 112 is substantially formed on the entire surface of the substrate 110, the gate insulating layer 112 may be patterned with the same shape as the first gate electrode 124 and the second gate electrode 134.

The gate insulating layer 112 may be formed of an inorganic insulating material such as silicon oxide $SiO_x$ or silicon nitride SiNx. When the first semiconductor layer 122 and the second semiconductor layer 132 are formed of an oxide semiconductor material, the gate insulating layer 112 may be formed of silicon oxide $SiO_x$. In contrast, when the first semiconductor layer 122 and the second semiconductor layer 132 are formed of polycrystalline silicon, the gate insulating layer 112 may be formed of silicon oxide $SiO_x$ or silicon nitride SiNx.

A first gate electrode 124 and a second gate electrode 134 which are formed of a conductive material, such as metal, are formed above the gate insulating layer 112 so as to correspond to the first semiconductor layer 122 and the second semiconductor layer 132, respectively. Further, a gate line (not illustrated) may be formed above the gate insulating layer 112. The gate line may extend along one direction.

The interlayer insulating layer 113 which is formed of an insulating material is substantially formed on the entire surface of the substrate 110, above the first gate electrode 124 and the second gate electrode 134. The interlayer insulating layer 113 may be formed of an inorganic insulating material such as silicon oxide $SiO_x$ or silicon nitride SiNx or an organic insulating material such as photo acryl or benzocyclobutene.

The interlayer insulating layer 113 has a contact hole which exposes both top surfaces of the first semiconductor layer 122 and the second semiconductor layer 132. The contact hole may be also formed in the gate insulating layer 112. A first source electrode 126 and a first drain electrode 128 and a second source electrode 136 and a second drain electrode 138 are formed of a conductive material, such as metal, in the first light emitting unit EA1-1 and the second light emitting unit EA2-1 above the interlayer insulating layer 113. Further, a data line (not illustrated) and a power line (not illustrated) which extend along a direction perpendicular to one direction may be formed above the interlayer insulating layer 113.

The first source electrode 126 and the first drain electrode 128 are in contact with both sides of the first semiconductor layer 122 through a contact hole of the interlayer insulating layer 113. The second source electrode 136 and the second drain electrode 138 are in contact with both sides of the second semiconductor layer 132 through the contact hole of the interlayer insulating layer 113. Even though it is not illustrated, the data line extends along a direction perpendicular to one direction and intersects the gate line to define a pixel area corresponding to each sub pixel and a power line which supplies a high potential voltage is located to be spaced apart from the data line.

One or more thin film transistors having the same structure as the first thin film transistor Tr1 and the second thin film transistor Tr2 may be further formed on the substrate 110 of each sub pixel, but are not limited thereto.

A planarization layer 114 is substantially formed on the entire surface of the substrate 110, as an insulating material, above the first source electrode 126, the first drain electrode 128, the second source electrode 136, and the second drain electrode 138. The planarization layer 114 is formed of an organic insulating material, such as photo acryl or benzocyclobutene. A top surface of the planarization layer 114 may be a flat surface.

In the meantime, an insulating layer which is formed of an inorganic insulating material, such as silicon oxide SiOx or silicon nitride SiNx, is further formed below the planarization layer 114, that is, between the first thin film transistor Tr1 and the second thin film transistor Tr2 and the planarization layer 114.

The planarization layer 114 has a first drain contact hole and a second drain contact hole which expose the first drain electrode 128 and the second drain electrode 138, respectively.

The first light emitting diode De1 and the second light emitting diode De2 may be disposed on the planarization layer 114 so as to correspond to the first light emitting unit EA1-1 and the second light emitting unit EA2-1. Referring to FIG. 4, the first light emitting diode De1 may include a first anode electrode 142-1, a first emission layer 144-1, and a cathode electrode 146 which are sequentially laminated on the planarization layer 114. Further, the second light emitting diode De2 may include a second anode electrode 152-1, a second emission layer 154-1, and a cathode electrode 146 which are sequentially laminated on the planarization layer 114.

The first anode electrode 142-1 and the second anode electrode 152-1 are formed above the planarization layer 114 with a conductive material having a relatively high work function. The first anode electrode 142-1 is located in the first light emitting unit EA1-1 and is in contact with the first drain electrode 128 through the first drain contact hole. Further, the second anode electrode 152-1 is located in the second light emitting unit EA2-1 and is in contact with the second drain electrode 138 through the second drain contact hole.

For example, each of the first anode electrode 142-1 and the second anode electrode 152-1 may be formed of a transparent conductive material, such as indium tin oxide (ITO) or indium zinc oxide (IZO), but is not limited thereto.

In the meantime, the light emitting display device 100 according to the exemplary embodiment of the present disclosure may be a top emission type in which light of the plurality of light emitting diodes De1 and De2 is output to an opposite direction to the substrate 110. Accordingly, each of the first anode electrode 142-1 and the second anode electrode 152-1 may further include a reflective electrode or a reflective layer which is formed of a metal material having a high reflectance below the transparent conductive material. For example, the reflective electrode or the reflective layer may be formed of an aluminum-palladium-copper (APC) alloy, silver (Ag), or aluminum (Al). At this time, each of the first anode electrode 142-1 and the second anode electrode 152-1 has a triple-layered structure of ITO/APC/ITO, ITO/Ag/ITO or ITO/Al/ITO, but is not limited thereto.

A bank layer 115 is formed above the first anode electrode 142-1 and the second anode electrode 152-1 as an insulating material. For example, the bank layer 115 may be formed of a polyimide resin, an acrylic resin, or a benzocyclobutene resin, but is not limited thereto. In the present disclosure, the bank layer 115 has a single layered structure, but may also have a double layered structure. That is, the bank layer 115 may have a double layered structure including a lower hydrophilic bank layer and an upper hydrophobic bank layer.

The bank layer 115 overlaps edges of the first anode electrode 142-1 and the second anode electrode 152-1 and covers the edges of the first anode electrode 142-1 and the second anode electrode 152-1. The bank layer 115 has a first opening 115*a*-1 and a second opening 115*b*-1 which expose the first anode electrode 142-1 and the second anode electrode 152-1.

The first emission layer 144-1 and the second emission layer 154-1 are formed above the first anode electrode 142-1 and the second anode electrode 152-1 which are exposed by the first opening 115*a*-1 and the second opening 115*b*-1 of the bank layer 115. Each of the first emission layer 144-1 and the second emission layer 154-1 may generate light with a luminance corresponding to a voltage difference between the first anode electrode 142-1 and the cathode electrode 146 and between the second anode electrode 152-1 and the cathode electrode 146. For example, the first emission layer 144-1 and the second emission layer 154-1 may include an emission material layer (EML) including an emission material. The emission material may include an organic material, an inorganic material, or a hybrid material.

The first emission layer 144-1 and the second emission layer 154-1 may have a multi-layered structure. For example, the first emission layer 144-1 and the second emission layer 154-1 may further include at least one of a hole injection layer HIL, a hole transport layer HTL, an electron transport layer ETL, and an electron injection layer EIL.

Referring to FIG. 4, the first emission layer 144-1 and the second emission layer 154-1 may be disposed in the first light emitting diode De1 and the second light emitting diode De2 to be spaced apart from each other. However, the first emission layer 144-1 and the second emission layer 154-1 may be disposed in the first light emitting diode De1 and the second light emitting diode De2 as a common layer. For example, the first emission layer 144-1 above the first anode electrode 142-1 and the second emission layer 154-1 above the second anode electrode 152-1 are connected to be integrally formed.

The cathode electrode 146 which is formed of a conductive material having a relatively low work function is substantially formed on the entire surface of the substrate 110, above the first emission layer 144-1 and the second emission layer 154-1. Here, the cathode electrode 146 may be formed of aluminum or magnesium, silver, or an alloy thereof. At this time, the cathode electrode 146 has a relatively thin thickness to allow light from the first emission layer 144-1 and the second emission layer 154-1 to pass therethrough. Further, the cathode electrode 146 may be formed of a transparent conductive material, such as indium gallium oxide (IGO), but is not limited thereto.

The encapsulation unit 160 is formed on the substantially entire surface of the substrate 110, above the cathode electrode 146. The encapsulation unit 160 suppresses the moisture or oxygen from being introduced into the first light emitting diode De1 and the second light emitting diode De2 from the outside.

The encapsulation unit 160 may have a multi-layered structure. For example, the encapsulation unit 160 may include a first encapsulation layer 162, a second encapsulation layer 164, and a third encapsulation layer 166 which are sequentially laminated. However, the exemplary embodiments of the present disclosure are not limited thereto.

The first encapsulation layer 162 is disposed on the first light emitting diode De1 and the second light emitting diode De2 to suppress the permeation of moisture or oxygen. The first encapsulation layer 162 may be formed of an inorganic material, such as silicon oxide (SiOx), silicon nitride (SiNx), silicon oxy nitride (SiNxOy), or aluminum oxide (AlyOz), but is not limited thereto.

The second encapsulation layer 164 is disposed on the first encapsulation layer 162 to planarize the surface. Further, the second encapsulation layer 164 may cover foreign materials or particles which may be generated during a manufacturing process. The second encapsulation layer 164 may be formed of an organic material, such as silicon oxy carbon (SiOxCz), acryl or epoxy-based resin, but is not limited thereto.

The third encapsulation layer 166 is disposed on the second encapsulation layer 164 and may suppress the permeation of the moisture or oxygen, like the first encapsulation layer 162. At this time, the third encapsulation layer 166 and the first encapsulation layer 162 may be formed to seal the second encapsulation layer 164. Therefore, the moisture or oxygen which permeate the first light emitting diode De1 and the second light emitting diode De2 may be effectively reduced by the third encapsulation layer 166. The third encapsulation layer 166 may be formed of an inorganic material, such as silicon oxide (SiOx), silicon nitride (SiNx), silicon oxy nitride (SiNxOy), or aluminum oxide (AlyOz), but is not limited thereto.

The light shielding pattern 170 is provided above the encapsulation unit 160. The light shielding pattern 170 is formed between adjacent first to third sub pixels SP1, SP2, and SP3 or formed between the first light emitting unit EA1-1 and the second light emitting unit EA2-1.

Such a light shielding pattern 170 may be a black matrix and may be formed of black resin or chrome oxide. In contrast, the light shielding pattern 170 may be a touch electrode and may be formed of metal. At this time, the touch electrode includes a plurality of transmission electrodes and a plurality of reception electrodes intersecting each other and senses a touch from a variation of a capacitance between the plurality of transmission electrodes and the plurality of reception electrodes.

The optical gap layer 175 is provided above the light shielding pattern 170. The optical gap layer 175 ensures an optical gap between the first light emitting diode De1 and the second light emitting diode De2 and the first lens 182-1 and the second lens 184-1 to refract the light from the first light emitting diode De1 and the second light emitting diode De2 to a specific direction by the first lens 182-1 and the second lens 184-1. By doing this, the efficiency of the first lens 182-1 and the second lens 184-1 may be improved. The optical gap layer 175 may have a thickness of several to several tens of μm and may be formed of an organic insulating material.

For example, the optical gap layer 175 is formed of photo acryl, benzocyclobutene (BCB), polyimide (PI), or polyamide (PA), but is not limited thereto.

The first lens 182-1 and the second lens 184-1 are disposed in an area corresponding to the first light emitting unit EA1-1 and the second light emitting unit EA2-1, above the optical gap layer 175. Accordingly, light generated by the first light emitting diode De1 may be emitted through the first lens 182-1 of the corresponding sub pixel. Also, light generated by the second light emitting diode De2 of each sub pixel may be emitted through the second lens 184-1 of the corresponding sub pixel.

The first lens 182-1 and the second lens 184-1 refract light to a specific direction to restrict the viewing angle. That is, the first lens 182-1 is disposed in the first light emitting unit EA1-1 to refract light from the first light emitting diode De1 to a specific direction. Further, the second lens 184-1 is disposed in the second light emitting unit EA2-1 to refract light from the second light emitting diode De2 to a specific direction.

The first lens 182-1 and the second lens 184-1 may have a shape that does not limit light in one direction. For example, the first lens 182-1 and the second lens 184-1 may be half-cylindrical lenses. Therefore, first light emitted from the first light emitting diode De1 of each sub pixel SP1, SP2, and SP3 is refracted at a specific angle by the first lens 182-1 to be output. Further, second light emitted from the second light emitting diode De2 of each sub pixel SP1, SP2, and SP3 is refracted at a specific angle by the second lens 184-1 to be output. Accordingly, the viewing angle of each of the sub pixels SP1, SP2, and SP3 may be restricted. At this time, a viewing angle restriction direction of the first lenses 182-1, 182-2, and 182-3 and the second lenses 184-1, 184-2, and 184-3 is different and a wide viewing angle and a narrow viewing angle may be implemented by selective driving.

Hereinafter, an operation of selectively implementing a wide field-of-view mode and a narrow field-of-view mode when the light emitting display device is in a portrait mode and a landscape mode will be described in detail with reference to FIGS. 5, 6A, and 6B.

The first lens 182-1 and the second lens 184-1 are half-cylindrical lenses and have a rectangular cross-section in one direction and a semi-circular cross-section in the other direction. The half-cylindrical lens does not restrict the viewing angle in one direction, but may restrict the viewing angle in the other direction.

Figure 5:
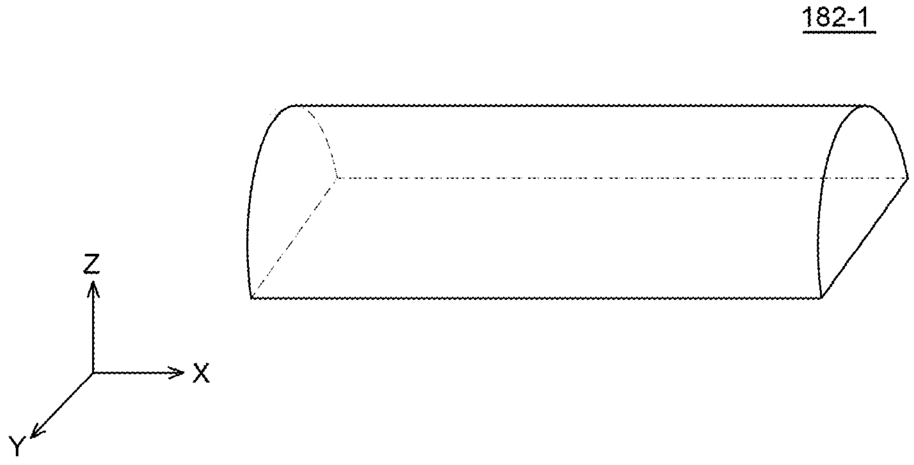
FIG. 5 is a view schematically illustrating a first lens of a light emitting display device according to an exemplary embodiment of the present disclosure.

Specifically, referring to FIG. 5, the first lens 182-1 may have a half-cylindrical shape which extends long in the X-axis direction. Specifically, the first lens 182-1 has a rectangular cross-section in the X-axis direction and a semi-circular cross-section in the Y-axis direction. Accordingly, the first lens 182-1 restricts the viewing angle in the Y-axis direction and does not restrict the viewing angle of the X-axis direction of the first lens 182-1. For example, the first light emitting unit EA1-1 including the half-cylindrical first lens 182-1 has a narrow viewing angle of 30 degrees or smaller in the Y-axis direction and may have a wide viewing angle of 60 degrees or larger in the X-axis direction.

In the meantime, the second lens 184-1 may have a half-cylindrical shape extending long in the Y-axis direction. Specifically, the second lens 184-1 has a rectangular cross-section in the Y-axis direction and a semi-circular cross-section in the X-axis direction. Accordingly, each the second lens 184-1 restricts a viewing angle in the X-axis direction, but does not restrict the viewing angle in the Y-axis direction. For example, the second light emitting unit EA2-1 including the half-cylindrical second lens 184-1 has a narrow viewing angle of 30 degrees or smaller in the horizontal direction and has a wide viewing angle of 60 degrees or larger in the vertical direction.

The second lens 184-1 may have the same shape as the first lens 182-1. However, the first lens and the second lens may be disposed in different directions. To be more specific, referring to FIG. 3, the first lenses 182-1, 182-2, and 182-3 disposed in the first to third sub pixels SP1, SP2, and SP3 have a shape corresponding to the first light emitting units EA1-1, EA1-2, and EA1-3 having a rectangular shape in which a length of the X-axis direction is longer than a length of the Y-axis direction. Therefore, the first lenses 182-1, 182-2, and 182-3 may be disposed to extend long in the X-axis direction. Further, the second lenses 184-1, 184-2, and 184-3 disposed in the first to third sub pixels SP1, SP2, and SP3 have a shape corresponding to the second light emitting units EA2-1, EA2-2, and EA2-3 having a rectangular shape in which a length of the Y-axis direction is longer than a length of the X-axis direction. Therefore, the second lenses 184-1, 184-2, and 184-3 may be disposed to extend long in the Y-axis direction.

By doing this, based on the structure illustrated in FIG. 3, the first lenses 182-1, 182-2, and 182-3 restrict the viewing angle in the Y-axis direction, but do not restrict the viewing angle in the X-axis direction. The second lenses 184-1, 184-2, and 184-3 restrict the viewing angle in the X-axis direction, but do not restrict the viewing angle in the Y-axis direction.

The shape and the placement structure of the first lenses 182-1, 182-2, and 182-3 and the second lenses 184-1, 184-2, and 184-3 and implementation of the wide field-of-view mode and the narrow field-of-view mode in each of the portrait mode and the landscape mode of the light emitting display device thereby will be described in detail below.

Referring to FIG. 4, a lens protection layer 190 is provided above the first lens 182-1 and the second lens 184-1 to protect the first lens 182-1 and the second lens 184-1. The lens protection layer 190 is formed of an organic insulating material and has a flat top surface. Further, a refractive index of the lens protection layer 190 may be smaller than refractive indexes of the first lens 182-1 and the second lens 184-1.

For example, the lens protection layer 190 is formed of photo acryl, benzocyclobutene (BCB), polyimide (PI), or polyamide (PA), but is not limited thereto.

Hereinafter, an operation of selectively implementing the wide field-of-view mode and the narrow field-of-view mode when the light emitting display device is a portrait mode and a landscape mode will be described in detail.

Figure 6A:
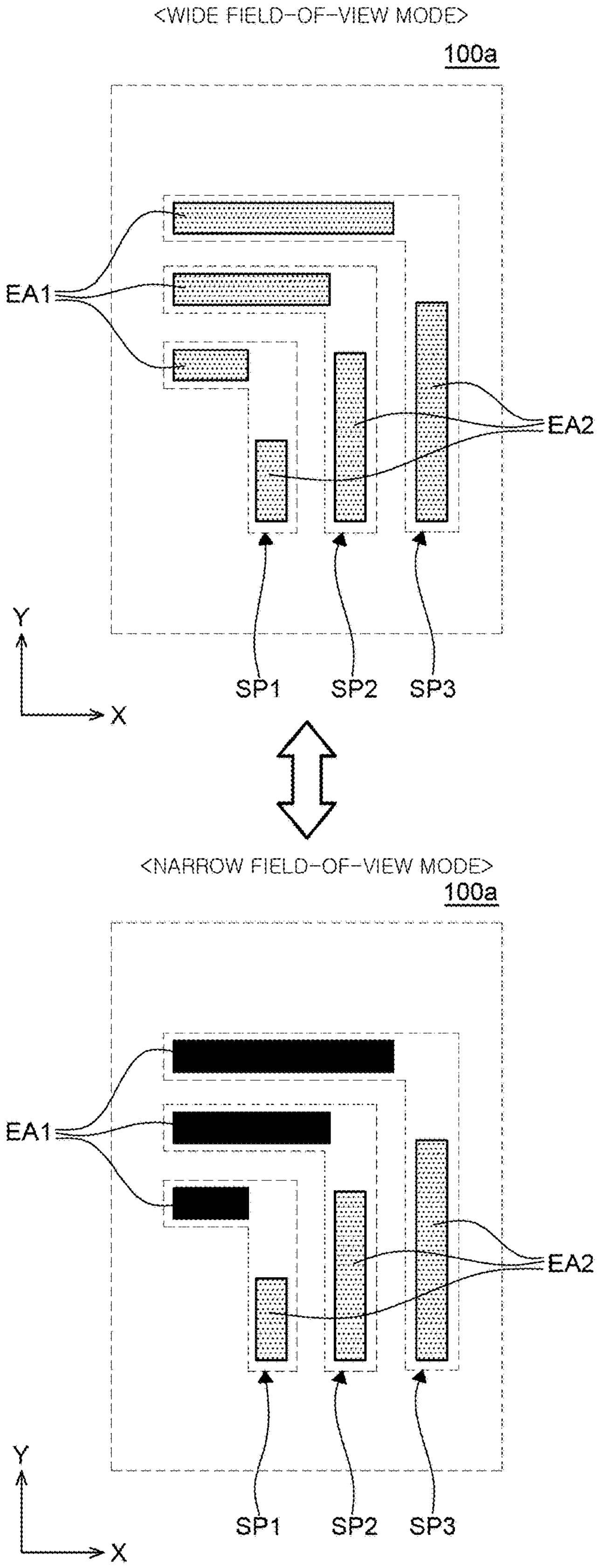
FIG. 6A is a view schematically illustrating an operation of a wide field-of-view mode and a narrow field-of-view mode when a light emitting display device of the present disclosure is in a portrait mode.

FIG. 6A is a view schematically illustrating an operation of the wide field-of-view mode and the narrow field-of-view mode in the portrait mode in which the light emitting display device of the present disclosure is disposed long in the vertical direction (for example, Y-axis direction). FIG. 6B is a view schematically illustrating an operation of the wide field-of-view mode and the narrow field-of-view mode in the landscape mode in which the light emitting display device of the present disclosure is disposed long in the horizontal direction (for example, X-axis direction).

First, as illustrated in FIG. 6A, one pixel PX of a light emitting display device according to an exemplary embodiment of the present disclosure includes first to third sub pixels SP1, SP2, and SP3. Each of the first, second, and third sub pixels SP1, SP2, and SP3 has a first light emitting unit EA1 and a second light emitting unit EA2.

The first light emitting unit EA1 has an emission area extending long in the X-axis direction and the second light emitting unit EA2 has an emission area extending long in the Y-axis direction. At this time, a half-cylindrical first lens which extends in the X-axis direction is provided so as to correspond to the first light emitting unit EA1 and a half-cylindrical second lens which extends in the Y-axis direction is provided so as to correspond to the second light emitting unit EA2.

Referring to FIGS. 1 to 5, the gyroscope sensor GS included in the light emitting display device 100 detects an orientation direction of the light emitting display device 100 and generates an orientation signal GMS which controls the display panel PN to the portrait mode or the landscape mode to supply the orientation signal to the timing controller T-con. At this time, the timing controller T-con transmits an emission signal which is driven in the wide field-of-view mode and the narrow field-of-view mode in each of the portrait mode and the landscape mode to the pixel circuit of each sub pixel, based on the orientation signal GMS transmitted from the gyroscopic sensor GS.

When the light emitting display device 100 is driven in the portrait mode 100*a*, the wide field-of-view mode and the narrow field-of-view mode may be implemented according to the user's choice in response to the emission signal supplied from the timing controller T-con.

Specifically, referring to FIG. 6A, when the light emitting display device operates in the wide field-of-view mode in the portrait mode 100*a*, both the first light emitting diode De1 of the first light emitting unit EA1 and the second light emitting diode De2 of the second light emitting unit EA2 are turned on in response to the emission signal supplied from the timing controller T-con. Light emitted from the first light emitting diode De1 has a viewing angle restricted in the Y-axis direction, that is, the vertical direction, by the first lens, and is output in the X-axis direction, that is, in the horizontal direction without restricting the viewing angle. Further, light emitted from the second light emitting diode De2 has a viewing angle restricted in the X-axis direction, that is, the horizontal direction, by the second lens 184-1, and is output in the Y-axis direction, that is, in the vertical direction without restricting the viewing angle. The viewing angle of the light emitted from the first light emitting diode De1 is restricted in the vertical direction and the viewing angle of the light emitted from the second light emitting diode De2 is restricted in the horizontal direction. However, as the first light emitting diode De1 and the second light emitting diode De2 simultaneously emit light, a wide viewing angle in both the vertical direction and the horizontal direction may be provided to the user.

In contrast, when the light emitting display device operates in the narrow field-of-view mode in the portrait mode 100*a*, the first light emitting diode De1 of the first light emitting unit EA1 is turned off and the second light emitting diode De2 of the second light emitting unit EA2 is turned on in response to the emission signal supplied from the timing controller T-con. By doing this, the first light emitting diode De1 does not emit light and light emitted from the second light emitting diode De2 has a viewing angle restricted in the X-axis direction, that is, the horizontal direction, by the second lens 184-1, and is output in the Y-axis direction, that is, in the vertical direction without restricting the viewing angle. By doing this, the viewing angle in the horizontal direction of the user is restricted and the privacy is assured, by the user's choice.

Figure 6B:
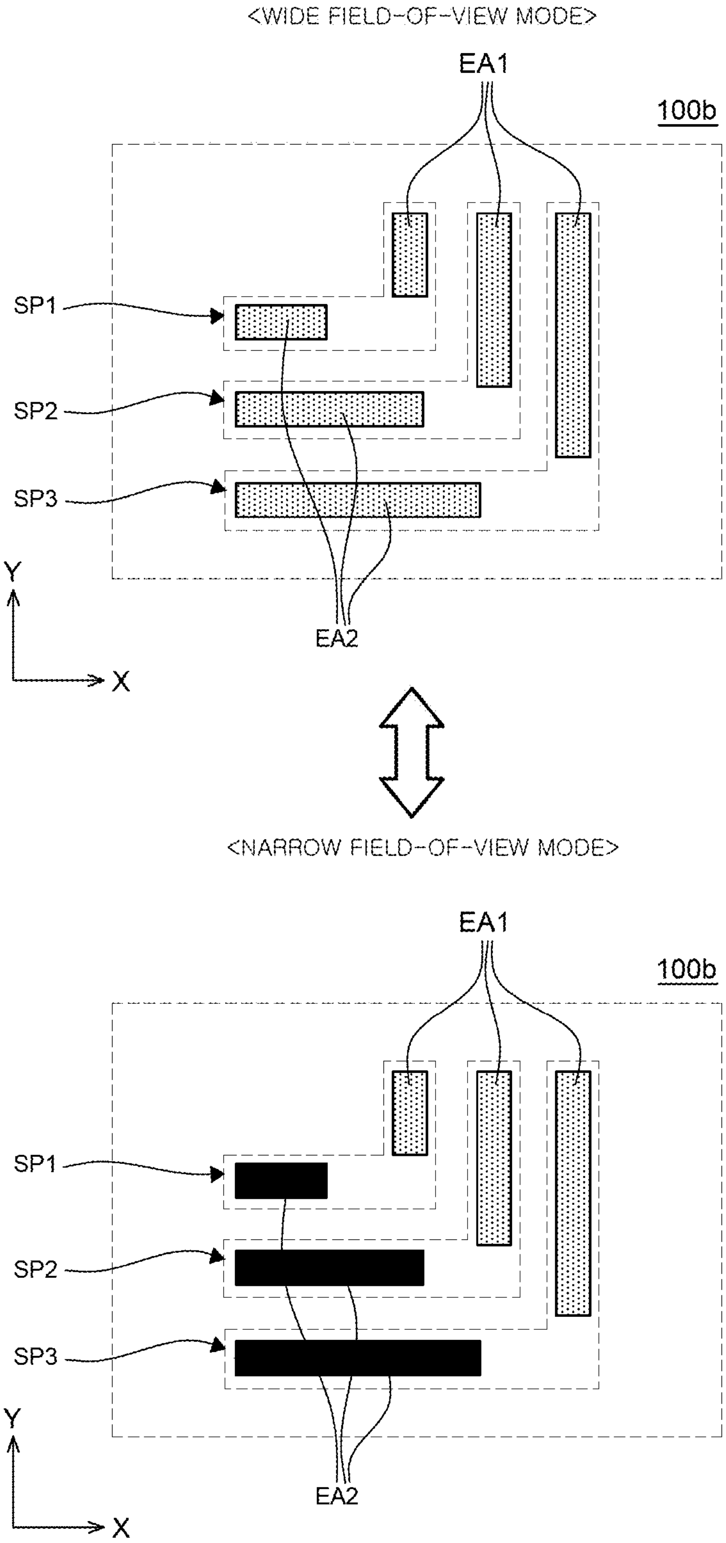
FIG. 6B is a view schematically illustrating an operation of a wide field-of-view mode and a narrow field-of-view mode when a light emitting display device of the present disclosure is in a landscape mode.

Next, as illustrated in FIG. 6B, the light emitting display device according to the exemplary embodiment of the present disclosure may be changed from the portrait mode 100*a* illustrated in FIG. 6A to the landscape mode 100*b*, by the user's choice.

The gyroscopic sensor GS detects that the light emitting display device 100 is changed to the landscape mode 100*b* to supply the orientation signal GMS to the timing controller T-con. Therefore, when the light emitting display device 100 is driven in the landscape mode 100*b*, the wide field-of-view mode and the narrow field-of-view mode may be implemented according to the user's choice in response to the emission signal supplied from the timing controller T-con.

As compared with the portrait mode 100*a* illustrated in FIG. 6A, in the landscape mode 100*b* illustrated in FIG. 6B, the first light emitting unit EA1 has an emission area which extends long in the Y-axis direction and the second light emitting unit EA2 has an emission area which extends long in the X-axis direction. By doing this, the first lens has a shape extending in the Y-axis direction and the second lens has a shape extending in the X-axis direction.

When the light emitting display device operates in the wide field-of-view mode in the landscape mode 100*b*, both the first light emitting diode De1 of the first light emitting unit EA1 and the second light emitting diode De2 of the second light emitting unit EA2 are turned on in response to the emission signal supplied from the timing controller T-con, as in the portrait mode 100*a*. By doing this, the viewing angle of the light emitted from the first light emitting diode De1 is restricted in the horizontal direction and the viewing angle of the light emitted from the second light emitting diode De2 is restricted in the vertical direction. However, as the first light emitting diode De1 and the second light emitting diode De2 simultaneously emit light, a wide viewing angle in both the vertical direction and the horizontal direction may be provided to the user.

In contrast, when the light emitting display device operates in the narrow field-of-view mode in the landscape mode 100*b*, the first light emitting diode De1 of the first light emitting unit EA1 is turned on and the second light emitting diode De2 of the second light emitting unit EA2 is turned off. By doing this, light emitted from the first light emitting diode De1 has a viewing angle restricted in the X-axis direction, that is, the horizontal direction, by the first lens and is output in the Y-axis direction, that is, in vertical direction without restricting the viewing angle and the second light emitting diode De2 does not emit light. By doing this, the viewing angle in the horizontal direction of the user may be restricted and the privacy may be assured, by the user's choice.

As seen from FIGS. 6A and 6B, the light emitting display device according to the exemplary embodiment of the present disclosure selectively operates the first light emitting unit EA1 and the second light emitting unit EA2 in one sub pixel, in the portrait mode 100*a* and the landscape mode 100*b*, to implement a narrow field-of-view mode.

Hereinafter, a configuration and a driving method of pixel circuits of the plurality of sub pixels will be described in detail.

Switch elements which configure each of the plurality of sub pixels may be implemented by an n-type or a p-type MOSFET transistor. In the following exemplary embodiment, a p-type transistor will be described as an example, but the present disclosure is not limited thereto.

Additionally, a transistor is a three-electrode element including a gate electrode, a source electrode, and a drain electrode. The source electrode is an electrode which supplies carriers to the transistor. In the transistor, the carriers flow from the source electrode. The drain electrode is an electrode through which the carriers are output from the transistor to the outside. Accordingly, the carrier in the MOSFET flows from the source electrode to the drain electrode. In the case of the n-type MOSFET (NMOS), since the carriers are electrons, in order to allow the electrons to flow from the source electrode to the drain electrode, a voltage of the source electrode is lower than a voltage of the drain electrode. In the n-type MOSFET, since the electrons flow from the source electrode to the drain electrode, the current flows from the drain electrode to the source electrode. In the case of the p-type MOSFET (PMOS), since the carriers are holes, in order to allow the holes to flow from the source electrode to the drain electrode, a voltage of the source electrode is higher than a voltage of the drain electrode. In the p-type MOSFET, since the holes flow from the source electrode to the drain electrode, the current flows from the source electrode to the drain electrode. However, it should be noted that the source electrode and the drain electrode of the MOSFET are not fixed. For example, the source electrode and the drain electrode of the MOSFET may be changed depending on the applied voltage. In the following exemplary embodiment, the present disclosure should not be limited by the source electrode and the drain electrode of the transistor.

Figure 7:
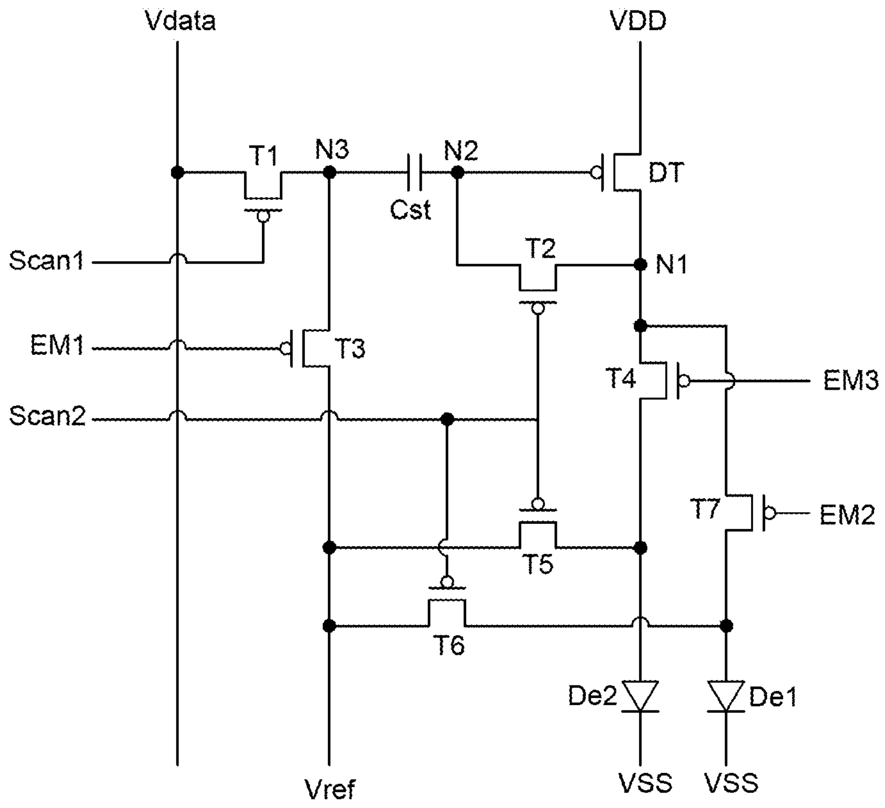
FIG. 7 is an example of a sub pixel circuit of a display device according to an exemplary embodiment of the present disclosure.

FIG. 7 is a circuit diagram illustrating a sub pixel of a light emitting display device according to an exemplary embodiment of the present disclosure.

Each of the plurality of sub pixels SP1, SP2, and SP3 includes a plurality of light emitting diodes De1 and De2, a driving transistor DT, first to seventh transistors T1 to T7, and a capacitor Cst.

The plurality of light emitting diodes De1 and De2 includes a first light emitting diode De1 and a second light emitting diode De2. Further, each of the first light emitting diode De1 and the second light emitting diode De2 emits light by a driving current which is supplied from the driving transistor DT. Specifically, the anode electrode of the first light emitting diode De1 is connected to the seventh transistor T7. Also, the cathode electrode of the first light emitting diode De1 is connected to an input terminal of the low potential driving voltage VSS. Further, the anode electrode of the second light emitting diode De2 is connected to the fourth transistor T4 and the cathode electrode of the second light emitting diode De2 is connected to an input terminal of the low potential driving voltage VSS.

The driving transistor DT controls a driving current applied to the plurality of light emitting diodes De1 and De2 in accordance with its source-gate voltage Vsg. Further, a source electrode of the driving transistor DT is connected to an input terminal of the high potential driving voltage VDD, a gate electrode is connected to a second node N2, and a drain electrode is connected to a first node N1.

The first transistor T1 applies a data voltage Vdata supplied from the data line to the third node N3. The first transistor T1 includes a source electrode connected to a data line, a drain electrode connected to the third node N3, and a gate electrode connected to a first scan signal line which transmits a first scan signal Scan1. Accordingly, the first transistor T1 applies a data voltage Vdata supplied from the data line to the third node N3, in response to a low level of first scan signal Scan1 which is a turn-on level.

The second transistor T2 forms diode connection with a gate electrode and a drain electrode of the driving transistor DT. The second transistor T2 includes a drain electrode connected to the second node N2, a source electrode connected to the first node N1, and a gate electrode connected to a second scan signal line which transmits a second scan signal Scan2. Therefore, the second transistor T2 forms a diode connection between the gate electrode and the drain electrode of the driving transistor DT in response to a low level of second scan signal Scan2 which is a turn-on level.

The third transistor T3 applies a reference voltage Vref to the third node N3. The third transistor T3 includes a source electrode connected to a reference voltage line which transmits a reference voltage Vref, a drain electrode connected to the third node N3, and a gate electrode connected to a first emission signal line which transmits a first emission signal EM1. Accordingly, the third transistor T3 applies the reference voltage Vref to the third node N3 in response to a low level of first emission signal EM1 which is a turn-on level.

The fourth transistor T4 forms a current path between the driving transistor DT and the second light emitting diode De2. The fourth transistor T4 includes a source electrode connected to the first node N1, a drain electrode connected to the anode electrode of the second light emitting diode De2, and a gate electrode connected to a third emission signal line which transmits a third emission signal EM3. The fourth transistor T4 forms a current path between the first node N1 which is a source electrode of the fourth transistor T4 and the second light emitting diode De2 in response to the third emission signal EM3. Accordingly, the fourth transistor T4 forms a current path between the driving transistor DT and the second light emitting diode De2 in response to a low level of third emission signal EM3 which is a turn-on level.

The fifth transistor T5 applies the reference voltage Vref to the anode electrode of the second light emitting diode De2. The fifth transistor T5 may include a source electrode connected to the reference voltage line which supplies the reference voltage Vref, a drain electrode connected to the anode electrode of the second light emitting diode De2, and a gate electrode connected to a second scan signal line SL2 to which a second scan signal Scan2 is applied. The fifth transistor T5 may be turned on or turned off by the second scan signal Scan2. Therefore, the fifth transistor T5 may apply the reference voltage Vref to the anode electrode of the second light emitting diode De2 in response to the low level of second scan signal Scan2 which is a turn-on level.

The sixth transistor T6 applies the reference voltage Vref to the anode electrode of the first light emitting diode De1. The sixth transistor T6 includes a source electrode connected to the reference voltage line which supplies the reference voltage Vref, a drain electrode connected to the anode electrode of the first light emitting diode De1, and a gate electrode connected to a second scan signal line which transmits a second scan signal Scan2. The sixth transistor T6 may be turned on or turned off by the second scan signal Scan2. Therefore, the sixth transistor T6 applies the reference voltage Vref to the anode electrode of the first light emitting diode De1 in response to the low level of second scan signal Scan2 which is a turn-on level.

The seventh transistor T7 forms a current path between the driving transistor DT and the first light emitting diode De1. The seventh transistor T7 includes a source electrode connected to the first node N1, a drain electrode connected to the anode electrode of the first light emitting diode De1, and a gate electrode connected to a second emission signal line which transmits a second emission signal EM2. The seventh transistor T7 forms a current path between the first node N1 which is a source electrode of the seventh transistor T7 and the first light emitting diode De1 in response to the second emission signal EM2. Accordingly, the seventh transistor T7 forms a current path between the driving transistor DT and the first light emitting diode De1 in response to a low level of second emission signal EM2 which is a turn-on level.

The capacitor Cst includes a first electrode connected to the second node N2 and a second electrode connected to the third node N3. That is, one electrode of the capacitor Cst is connected to the gate electrode of the driving transistor DT and the other electrode of the storage capacitor Cst is connected to the first transistor T1 and the third transistor T3.

Figure 8A:
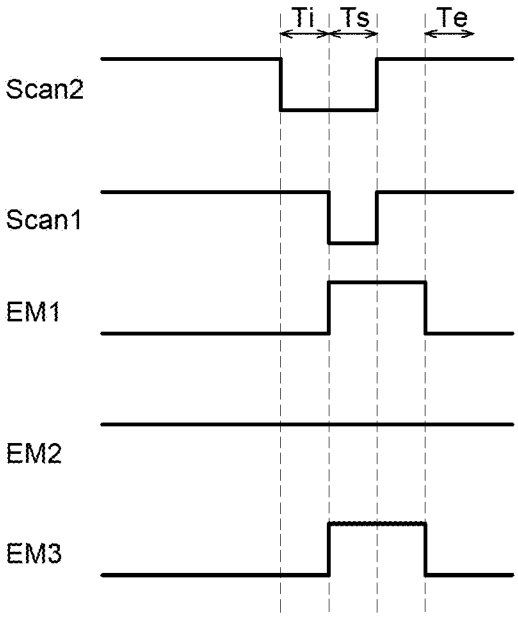
FIG. 8A is a waveform chart for explaining a sub pixel circuit of FIG. 7 in a narrow field-of-view mode when a light emitting display device according to an exemplary embodiment of the present disclosure is in a portrait mode.
Figure 8B:
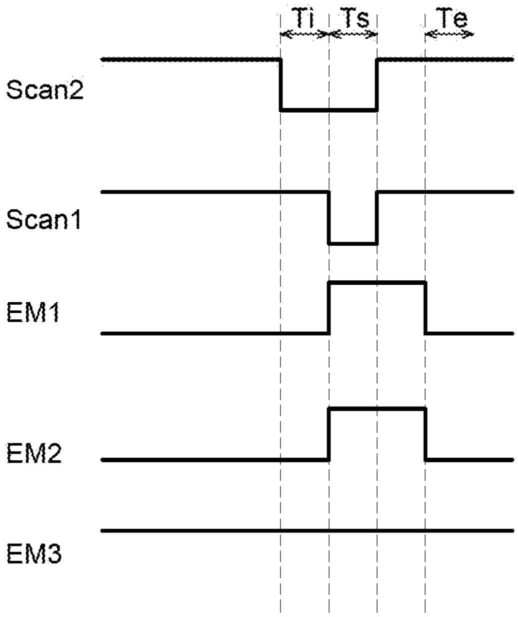
FIG. 8B is a waveform chart for explaining a sub pixel circuit of FIG. 7 in a narrow field-of-view mode when a light emitting display device according to an exemplary embodiment of the present disclosure is in a landscape mode.

FIGS. 8A and 8B are waveform charts for explaining a pixel circuit of FIG. 7.

FIG. 8A is a waveform chart illustrating an emission signal and a scan signal in a narrow field-of-view mode when a light emitting display device according to the exemplary embodiment of the present disclosure is in a portrait mode. FIG. 8B is a waveform chart illustrating an emission signal and a scan signal in a narrow field-of-view mode when a light emitting display device according to the exemplary embodiment of the present disclosure is in a landscape mode.

The light emitting display device according to the exemplary embodiment of the present disclosure may be divided into an initial period Ti, a sampling period Ts, and an emission period Te. The initial period Ti is a period in which the voltage of the second node N2 which is the gate electrode of the driving transistor DT is initialized. The sampling period Ts is a period in which a threshold voltage Vth of the driving transistor DT is sampled and the data voltage Vdata is programmed. The emission period Te is a period in which at least one of the light emitting diodes De1 and De2 emits light in accordance with the driving current by the source-gate voltage of the programmed driving transistor DT.

Referring to FIGS. 7 and 8A, when the light emitting display device is in a portrait mode, only the second light emitting diode De2 may emit light in the narrow field-of-view mode. In the narrow field-of-view mode, the second emission signal EM2 for controlling the emission of the first light emitting diode De1 to allow only the second light emitting diode De2 to emit light. That is, the second emission signal EM2 for forming a current path of the first driving current may be output only at a high level which is a turn-off level.

Specifically, during the initial period Ti, the first scan signal Scan1 is output at a high level and the second scan signal Scan2 may be output at a low level. Further, the second emission signal EM2 is output at a high level and the third emission signal EM3 and the first emission signal EM1 may be output at low levels. Therefore, the second transistor T2, the sixth transistor T6, and the fifth transistor T5 are turned on by the second scan signal Scan2. Also, the fourth transistor T4 is turned on by the third emission signal EM3, and the third transistor T3 may be turned on by the first emission signal EM1.

The third node N3 is initialized to the reference voltage Vref through the third transistor T3 which is turned on by the first emission signal EM1. The anode electrodes of the first light emitting diode De1 and the second light emitting diode De2 may be initialized to the reference voltage Vref by the sixth switching transistor ST6 and the fifth transistor T5 which are turned on by the second scan signal Scan2. Further, the driving transistor DT is diode-connected through the turned-on second transistor T2 to operate as a diode. Finally, the reference voltage Vref which is transmitted to the anode electrode of the second light emitting diode De2 through the turned-on fifth transistor T5 is transmitted to the first node N1 and the second node N2 through the turned-on fourth transistor T4. Therefore, the first node N1 and the second node N2 may be initialized to the reference voltage Vref.

Next, during the sampling period Ts, the low level of first scan signal Scan1 and the low level of second scan signal Scan2 are output. Also, the third emission signal EM3 and the first emission signal EM1 may be output at a high level from the low level. A high level of first emission signal EM1 is output so that the third transistor T3 is turned off. Also, the first transistor T1 is turned on by the low level of first scan signal Scan1 to transmit the data signal to the third node N3. Further, the driving transistor DT is diode-connected by the turned-on second transistor T2 and a difference voltage of the first power voltage VDD and the threshold voltage is sampled to be supplied to the second node N2.

Finally, during the emission period Te, the low level of third emission signal EM3 and first emission signal EM1 are output and a high level of second emission signal EM2 may be output. The reference voltage Vref is applied to the third node N3 through the third transistor T3 which is turned on by the low level of first emission signal EM1. Also, the voltage of the third node N3 may become the difference voltage of the reference voltage Vref and the data signal (data voltage). Such voltage fluctuation may be reflected to the second node N2. The gate-source voltage Vgs of the driving transistor DT is set to a value Vdata−Vref+Vth obtained by subtracting the reference voltage Vref from the data signal (data voltage) and then adding the threshold voltage Vth to control the second driving current.

Further, the second driving current is supplied from the driving transistor DT to the second light emitting diode De2 through the turned-on fourth transistor T4 so that the second light emitting diode De2 may emit light. However, the second emission signal EM2 is output at a high level to turn off the seventh transistor T7 so that the first driving current from the driving transistor DT is not transmitted to the first light emitting diode De1. Accordingly, the second driving current is applied only to the second light emitting diode De2 so that only the second light emitting diode De2 may emit light.

Referring to FIGS. 7 and 8B, when the light emitting display device is in a landscape mode, only the first light emitting diode De1 may emit light in the narrow field-of-view mode. In the narrow field-of-view mode of the landscape mode, a third emission signal EM3 for controlling the emission of the second light emitting diode De2 to allow only the first light emitting diode De1 to emit light, that is, the third emission signal EM3 for forming a current path of the second driving current may be output only at a high level which is a turn-off level.

When the light emitting display device operates in the narrow field-of-view mode in the landscape mode, as compared with the narrow field-of-view mode in the portrait mode, the light emitting display device may be driven in the substantially same method as the narrow field-of-view mode in the portrait mode, except that the second emission signal EM2 and the third emission signal EM3 are output reversely. That is, the third emission signal EM3 is output only at a high level which is a turn-off level. Also, the second emission signal EM2 may be output at a low level which is a turn-on level during the emission period in which the second light emitting diode De2 emits light.

Specifically, first, referring to FIGS. 7 and 8B, during the initial period Ti, a low level of second scan signal Scan2, a low level of second emission signal EM2, and a low level of first emission signal EM1 may be output. The second transistor T2, the sixth transistor T6, and the fifth transistor T5 are turned on by the low level of second scan signal Scan2. Also, the seventh transistor T7 is turned on by the low level of second emission signal EM2, and the third transistor T3 may be turned on by the low level of first emission signal EM1.

The third node N3 may be initialized to the reference voltage Vref through the turned-on third transistor T3. A voltage of the anode electrode of the first light emitting diode De1 is initialized to the reference voltage Vref through the turned-on sixth transistor T6. Also, a voltage of the anode electrode of the second light emitting diode De2 may be initialized to the reference voltage Vref through the turned-on fifth transistor T5. Further, the driving transistor DT is diode-connected through the turned-on second transistor T2 to short the gate electrode and the drain electrode of the driving transistor DT so that the driving transistor DT may operate as a diode. Further, the reference voltage Vref which is transmitted to the anode electrode of the first light emitting diode De1 through the turned-on sixth transistor T6 is transmitted to the first node N1 and the second node N2 through the turned-on seventh transistor T7. Therefore, the first node N1 and the second node N2 may be initialized to the reference voltage Vref.

Next, during the sampling period Ts, the low level of first scan signal Scan1 and the low level of second scan signal Scan2 are output and the second emission signal EM2 may be output at a high level. A high level of first emission signal EM1 is output so that the third transistor T3 is turned off and the first transistor T1 is turned on by the low level of first scan signal Scan1 to transmit the data signal to the third node N3. Further, the driving transistor DT is diode-connected by the turned-on second transistor T2 and a different voltage of the first power voltage VDD and the threshold voltage is sampled to be supplied to the second node N2.

Further, during the holding period, the first scan signal Scan1 and the second scan signal Scan2 are output at a high level and all the first transistor T1, the second transistor T2, the sixth transistor T6, and the fifth transistor T5 may be turned off. However, even though the first transistor T1 is turned off, the data signal (data voltage) which has been input in the previous period (for example, the sampling period) may be maintained by the capacitor Cst.

Finally, during the emission period Te, the low level of second emission signal EM2 and first emission signal EM1 are output and a high level of third emission signal EM3 may be output. The reference voltage Vref is applied to the third node N3 through the third transistor T3 which is turned on by the low level of first emission signal EM1 and the voltage of the third node N3 may become the difference voltage of the reference voltage Vref and the data signal (data voltage). Such voltage fluctuation may be reflected to the second node N2. The gate-source voltage Vgs of the driving transistor DT is set to a value Vdata−Vref+Vth obtained by subtracting the reference voltage Vref from the data signal (data voltage) and then adding the threshold voltage Vth to control the first driving current.

Further, the first driving current is supplied from the driving transistor DT to the first light emitting diode De1 through the turned-on seventh transistor T7 so that the first light emitting diode De1 may emit light. However, the third emission signal EM3 is output at a high level to turn off the fourth transistor T4 so that the second driving current from the driving transistor DT is not transmitted to the second light emitting diode De2. Accordingly, the first driving current is applied only to the first light emitting diode De1 so that only the first light emitting diode De1 may emit light.

In the meantime, even though it is not illustrated in FIGS. 8A and 8B, in the wide field-of-view mode, when the light emitting display device is in both the portrait mode and the landscape mode, both the first light emitting diode De1 and the second light emitting diode De2 emit light. Accordingly, the operation of forming a waveform of the second emission signal EM2 and a first driving current thereby in the wide field-of-view mode is the substantially same as or similar to the operation of forming a waveform of the second emission signal EM2 and a first driving current thereby in the narrow field-of-view mode of the portrait mode which has been described with reference to FIG. 8A. Further, the operation of forming a waveform of the third emission signal EM3 and a second driving current thereby in the wide field-of-view mode is the substantially same as or similar to the operation of forming a waveform of the third emission signal EM3 and a second driving current thereby in the narrow field-of-view mode of the portrait mode which has been described with reference to FIG. 8B. Therefore, a redundant description will not be repeated.

A light emitting display device according to the exemplary embodiment of the present disclosure provides a first light emitting unit and a second light emitting unit which extend long in different directions in one sub pixel and includes a first lens and a second lens which extend long in different directions so as to correspond to the first light emitting unit and the second light emitting unit to provide different viewing angles according to a portrait mode and a landscape mode. At this time, the light emitting display device detects an orientation direction of the light emitting display device using the gyroscopic sensor and generates an orientation signal to control the display panel PN in the portrait mode or the landscape mode to provide the signal to the timing controller T-con. By doing this, a wide field-of-view mode and a narrow field-of-view mode may be implemented according to a portrait mode or a landscape mode, by the user's choice.

In the meantime, in order to implement the wide field-of-view mode and the narrow field-of-view mode in the portrait mode or the landscape mode, a structure in which a half-spherical lens is disposed on some of light emitting units may be considered. For example, a method that a half-cylindrical lens is disposed in the first light emitting unit and a half-spherical lens is disposed in the second light emitting unit to allow the second light emitting unit is considered to selectively emit light to restrict the viewing angle in the vertical and horizontal directions to implement the narrow field-of-view mode in the portrait mode and the landscape mode. However, when the half-spherical lens is disposed, there is a problem in that the aperture ratio of the second light emitting unit is significantly lowered to reduce a front luminance. Further, there may be a problem that the lifespan of the device is also shortened due to lowered aperture ratio. Accordingly, in the light emitting display device according to the exemplary embodiment of the present disclosure, a method of implementing the narrow field-of-view mode in the portrait mode and the landscape mode while ensuring the area of the emission area using the first light emitting unit and the first lens extending long in the first direction and the second light emitting unit and the second lens extending long in the second direction which is different from the first direction may be considered. By doing this, the luminance degradation and the shortened lifespan problems caused by the reduced area of the light emitting diode may be solved.

Figure 9:
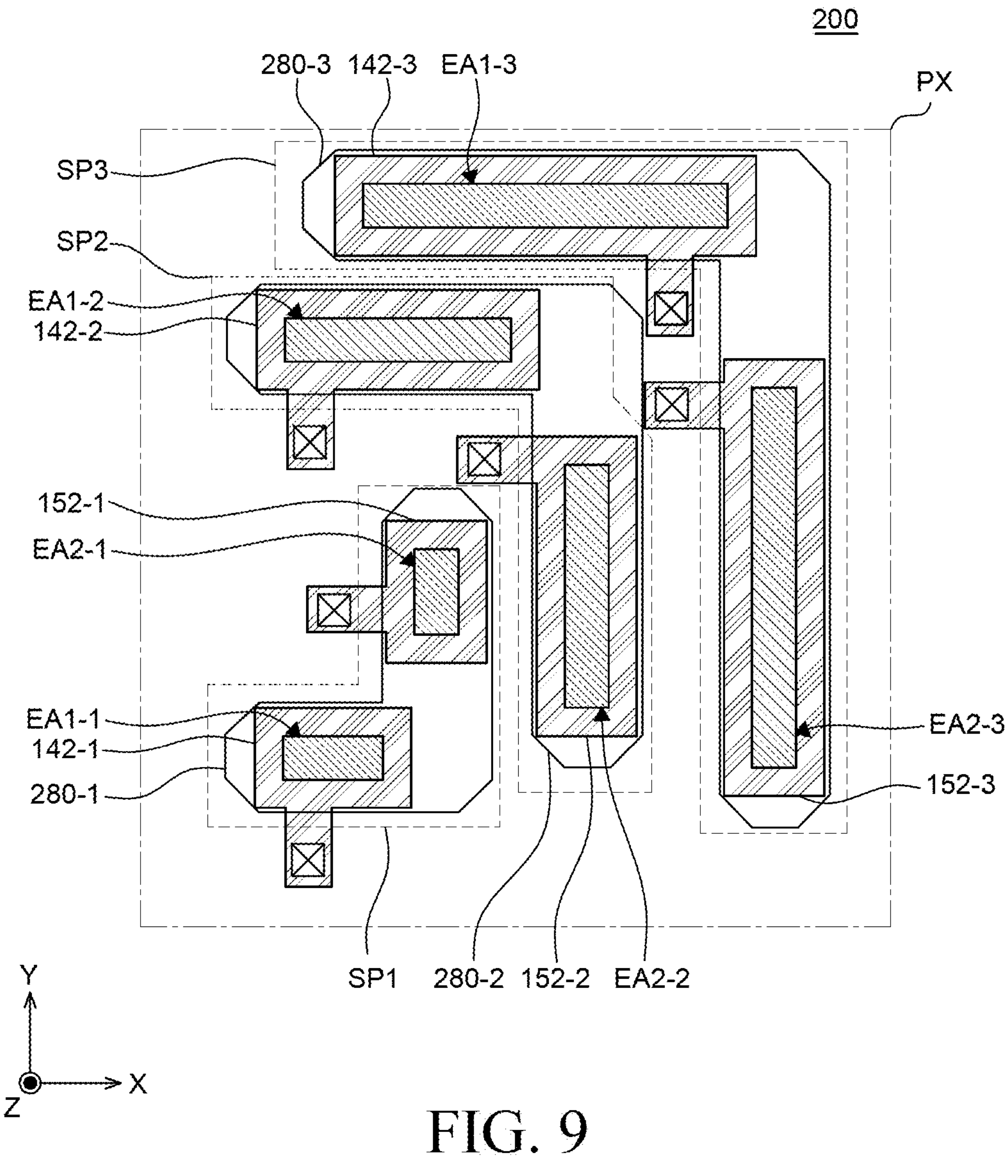
FIG. 9 is a plan view illustrating a pixel of a light emitting display device according to another exemplary embodiment of the present disclosure.

FIG. 9 is a plan view illustrating a pixel of a light emitting display device according to another exemplary embodiment of the present disclosure. A light emitting display device 200 illustrated in FIG. 9 is the substantially same as the light emitting display device 100 illustrated in FIG. 3 except for shapes of lenses 280-1, 280-2, and 280-3 disposed in a first sub pixel SP1, a second sub pixel SP2, and a third sub pixel SP3, respectively. Therefore, a description of repeated components will be omitted.

Referring to FIG. 9, the first sub pixel SP1, the second sub pixel SP2, and the third sub pixel SP3 include lenses 280-1, 280-2, and 280-3, respectively. At this time, as compared with the first lenses 182-1, 182-2, and 182-3 and the second lenses 184-1, 184-2, and 184-3 of the light emitting display device 100 illustrated in FIG. 3, the light emitting display device 200 illustrated in FIG. 9 includes lenses 280-1, 280-2, and 280-3 in which the first lens and the second lens are connected to have one integrated shape.

Specifically, the first light emitting unit EA1-1 of the first sub pixel SP1 extends long in the horizontal direction (e.g., X-axis direction) and the second light emitting unit EA2-1 extends long in the vertical direction (e.g., Y-axis direction). At this time, the lens 280-1 of the first sub pixel SP1 extends long in the horizontal direction (X-axis direction) so as to correspond to the first light emitting unit EA1-1 and then is bent toward the second light emitting unit EA2-1 to extend long in the vertical direction (Y-axis direction) so as to correspond to the second light emitting unit EA2-1. By doing this, the lens 280-1 of the first sub pixel SP1 may have an "L" shape having a bent portion. Namely, the lens 280-1 have an L-shape from a plan view.

In the same way, the lens 280-2 of the second sub pixel SP2 extends long in the horizontal direction (X-axis direction) so as to correspond to the first light emitting unit EA1-2 and then is bent toward the second light emitting unit EA2-2 to extend long in the vertical direction (Y-axis direction) so as to correspond to the second light emitting unit EA2-2. Further, the lens 280-3 of the third sub pixel SP3 extends long in the horizontal direction (X-axis direction) so as to correspond to the first light emitting unit EA1-3 and then is bent toward the second light emitting unit EA2-3 to extend long in the vertical direction (Y-axis direction) so as to correspond to the second light emitting unit EA2-3.

The lenses 280-1, 280-2, and 280-3 of the light emitting display device 200 illustrated in FIG. 9 may be formed to be longer than the first lenses 182-1, 182-2, and 182-3 and the second lenses 184-1, 184-2, and 184-3 of the light emitting display device 100 illustrated in FIG. 3. The lenses 280-1, 280-2, and 280-3 of the light emitting display device 200 illustrated in FIG. 9 have a half-cylindrical shape with a semi-circular cross-section in the short axis direction. Also, in the case of the half-cylindrical lens, the longer the length of the lens, the better the performance of the lens may be expected. Further, the first lenses 182-1, 182-2, and 182-3 and the second lenses 184-1, 184-2, and 184-3 are connected to be integrated so that the first lens and the second lens in one sub pixel are simultaneously formed to reduce manufacturing process steps.

In the meantime, the first lens and the second lens are connected to configure one integrated lens 280-1, 280-2, 280-3, light emitted from the first light emitting units EA1-1, EA1-2, and EA1-3 and the second light emitting units EA2-1, EA2-2, and EA2-3 is reflected in the lens to be emitted through a lens overlapping the other light emitting unit. In order to suppress this problem, a shortest distance between the first light emitting units EA1-1, EA1-2, and EA1-3 and the second light emitting units EA2-1, EA2-2, and EA2-3 may be 20 μm or larger, for example, 20 μm to 40 μm. Specifically, in the sub pixel which emits the same color light, when the shortest distance between the first light emitting units EA1-1, EA1-2, and EA1-3 and the second light emitting units EA2-1, EA2-2, and EA2-3 is smaller than 20 μm, if one light emitting unit operates, light is visible through another light emitting unit. Therefore, the viewing angle restriction performance may be degraded. Further, in two adjacent sub pixels which emit different color light, when the shortest distance between the first light emitting units EA1-1, EA1-2, and EA1-3 and the second light emitting units EA2-1, EA2-2, and EA2-3 is smaller than 20 μm, color mixture occurs due to another adjacent sub pixel to degrade the performance of the display device.

Figure 10:
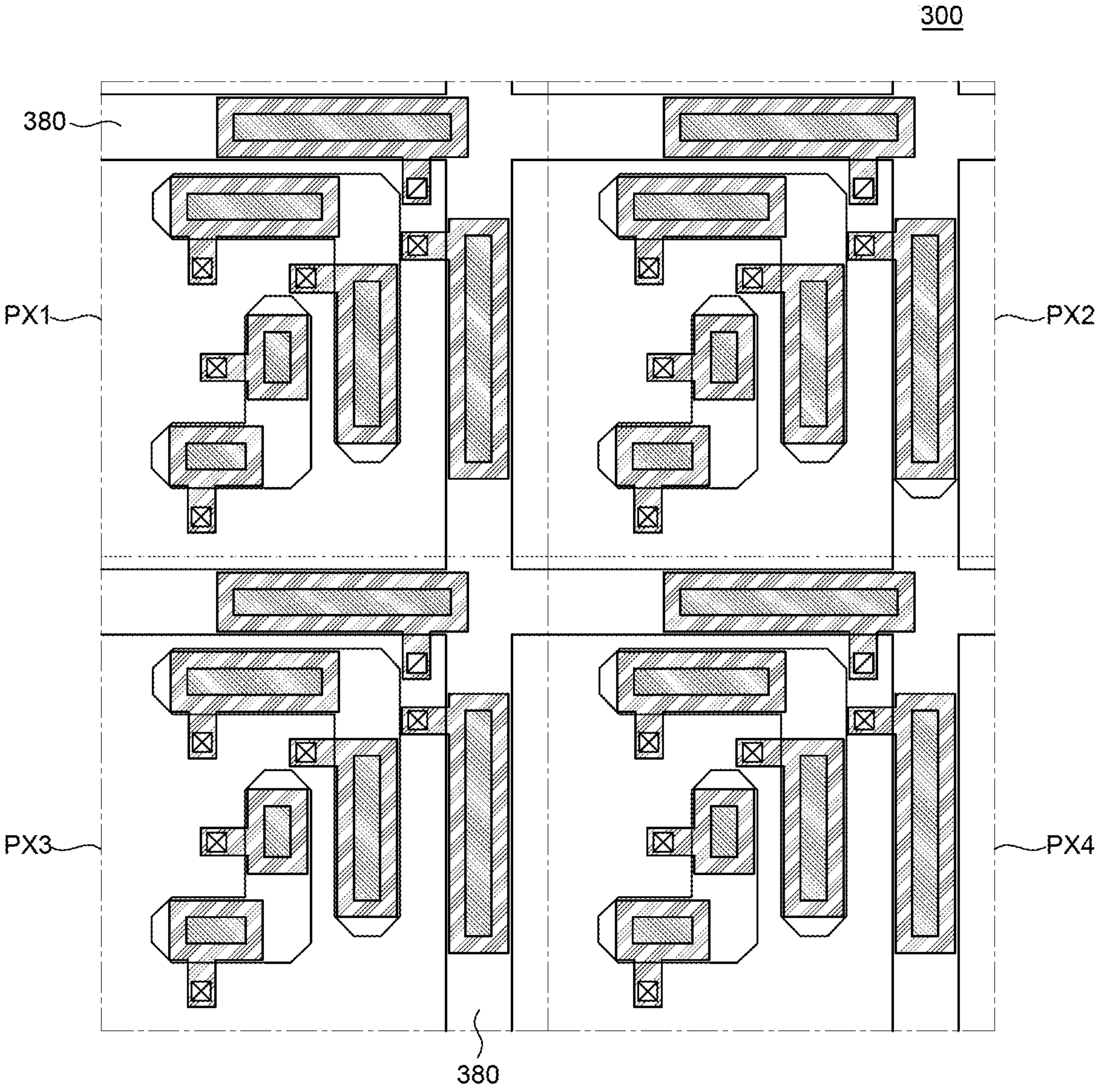
FIG. 10 is a plan view illustrating a pixel of a light emitting display device according to still another exemplary embodiment of the present disclosure.

FIG. 10 is a plan view illustrating a pixel of a light emitting display device according to still another exemplary embodiment of the present disclosure. The light emitting display device 300 illustrated in FIG. 10 is the substantially same as the light emitting display device 200 illustrated in FIG. 9 except for a shape of a lens 380 disposed in the third sub pixel SP3. Therefore, a description of repeated components will be omitted.

Referring to FIG. 10, when a plurality of pixels PX1, PX2, PX3, and PX4 are repeatedly disposed, lenses 380 of third sub pixels SP3 disposed in adjacent pixels are connected to each other.

Specifically, the light emitting display device 300 illustrated in FIG. 10 includes a first pixel PX1, a second pixel PX2 adjacent in a horizontal direction (X-axis direction) of the first pixel PX1, a third pixel PX3 adjacent in a vertical direction (Y-axis direction) of the first pixel PX1, and a fourth pixel PX4 adjacent in the horizontal direction (X-axis direction) of the third pixel PX3 and adjacent in the vertical direction (Y-axis direction) of the second pixel PX2. At this time, the lens 380 disposed so as to correspond to the third sub pixel SP3 of the first pixel PX1 extends long in the horizontal direction (X-axis direction) so as to correspond to the first light emitting unit EA1-3 to be formed so as to correspond to the first light emitting unit EA1-3 of the third sub pixel SP3 of the second pixel PX2. Further, the lens 380 disposed so as to correspond to the third sub pixel SP3 of the first pixel PX1 extends long in the vertical direction (Y-axis direction) so as to correspond to the second light emitting unit EA2-3 to be formed so as to correspond to the second light emitting unit EA2-3 of the third sub pixel SP3 of the third pixel PX3. That is, the lenses 380 disposed in the third sub pixels SP3 of the first to fourth pixels PX1, PX2, PX3, and PX4 are connected to each other to be integrally formed. For example, the lenses 380 disposed in the third sub pixel SP3 may have an integrated mesh pattern on the entire display panel PN.

When the third sub pixel SP3 is a blue sub pixel, the luminous efficiency is low so that the improvement of the performance of the half-cylindrical lens 380 may be expected by maximizing the length of the lens 380 disposed in the third sub pixel SP3 so that the luminous efficiency of the third sub pixel SP3 may be improved.

The exemplary embodiments of the present disclosure can also be described as follows:

According to an aspect of the present disclosure, there is provided a light emitting display device. The light emitting display device includes a plurality of pixels disposed in a display panel and each of the plurality of pixels includes a plurality of sub pixels. Each of the plurality of sub pixels includes a first light emitting diode including a first light emitting unit which extends long in a first direction; a first lens which is disposed on the first light emitting diode and refracts light from the first light emitting diode; a second light emitting diode including a second light emitting unit which extends long in a second direction which is perpendicular to the first direction; and a second lens which is disposed on the second light emitting diode and refracts light from the second light emitting diode.

Each of the plurality of sub pixels may include a first thin film transistor connected to the first light emitting diode; a second thin film transistor connected to the second light emitting diode; a planarization layer disposed on the first thin film transistor and the second thin film transistor; and a bank layer which is disposed on the planarization layer and includes a first opening which exposes a first anode electrode of the first light emitting diode and a second opening which exposes a second anode electrode of the second light emitting diode. The first opening extends long in the first direction so as to define the first light emitting unit and the second opening may extend long in the second direction so as to define the second light emitting unit.

The first lens and the second lens may be half-cylindrical lenses.

In the first lens, a length in the first direction may be longer than a length in the second direction and in the second lens, a length in the second direction may be longer than a length in the first direction.

The first lens and the second lens may be connected to each other to be bent.

A first light emitting unit and a second light emitting unit of each sub pixel may have the same area.

The plurality of sub pixels may include a red sub pixel, a green sub pixel, and a blue sub pixel, and first lenses of the red sub pixel, the green sub pixel, and the blue sub pixel may be disposed to be parallel. Second lenses of the red sub pixel, the green sub pixel, and the blue sub pixel may be disposed to be parallel.

A first lens of a blue sub pixel located in one pixel may be connected to a first lens of the blue sub pixel located in another pixel adjacent in the first direction. A second lens of a blue sub pixel located in one pixel may be connected to a second lens of the blue sub pixel located in another pixel adjacent in the second direction.

The first lens and the second lens may be connected to each other to have a mesh pattern. The first lens and the second lens have an L-shape from a plan view.

A shortest distance between the first light emitting diode and the second light emitting diode may be equal or larger than 20 μm.

A narrow field of view mode and a wide field of view mode may be selectively driven, in the wide field-of-view mode, both the first light emitting diode and the second light emitting diode may emit light, and in the narrow field-of-view mode, only any one of the first light emitting diode and the second light emitting diode may emit light.

When a narrow field-of-view mode and a wide field-of-view mode are selectively driven and the display panel is disposed vertically, in the wide field-of-view mode, both the first light emitting diode and the second light emitting diode may emit light, and in the narrow field-of-view mode, only the second light emitting diode may emit light. When the display panel is disposed horizontally, in the wide field-of-view mode, both the first light emitting diode and the second light emitting diode emit light, and in the narrow field-of-view mode, only the first light emitting diode emits light.

The light emitting display device may further comprise a data driver circuit which supplies a data signal to the display panel; a gate driver circuit which supplies a gate signal to the display panel; a timing controller which controls the data driver circuit and the gate driver circuit; and a gyroscopic sensor which senses an orientation direction of the display panel.

The gyroscopic sensor may supply a signal for the orientation direction of the display panel to the timing controller and the timing controller controls an emission signal which is applied to the pixel circuit of each of the plurality of sub pixels according to the orientation direction of the light emitting display device, based on a signal transmitted from the gyroscopic sensor.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. Other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display device, comprising:

a display panel including a plurality of pixels, each of the plurality of pixels including a plurality of sub pixels, wherein each of the plurality of sub pixels includes:

a first light emitting diode including a first light emitting unit extending in a first direction and a second direction transverse to the first direction, the first light emitting unit extending longer in the first direction than in the second direction;

a first lens which is disposed on the first light emitting diode and refracts light from the first light emitting diode;

a second light emitting diode including a second light emitting unit extending in the first direction and in the second direction, the second light emitting unit extending longer in the second direction than the first direction; and a second lens which is disposed on the second light emitting diode and refracts light from the second light emitting diode, wherein the first and second directions are transverse to a thickness of the display panel.

2. The light emitting display device according to claim 1, wherein each of the plurality of sub pixels includes:

a first thin film transistor electrically connected to the first light emitting diode;

a second thin film transistor electrically connected to the second light emitting diode;

a planarization layer disposed on the first thin film transistor and the second thin film transistor; and a bank layer which is disposed on the planarization layer and includes a first opening which exposes a first anode electrode of the first light emitting diode and a second opening which exposes a second anode electrode of the second light emitting diode, wherein the first opening extends long in the first direction so as to define the first light emitting unit and wherein the second opening extends long in the second direction so as to define the second light emitting unit.

3. The light emitting display device according to claim 1, wherein the first lens and the second lens are half-cylindrical lenses.

4. The light emitting display device according to claim 3, wherein in the first lens, a length in the first direction is longer than a length in the second direction and in the second lens, a length in the second direction is longer than a length in the first direction.

5. The light emitting display device according to claim 4, wherein the first lens and the second lens are coupled to each other, and wherein the first lens and the second lens have an L-shape from a plan view.

6. The light emitting display device according to claim 5, a shortest distance between the first light emitting diode and the second light emitting diode is 20 μm to 40 μm.

7. The light emitting display device according to claim 1, wherein a first light emitting unit and a second light emitting unit of each sub pixel have the same area.

8. The light emitting display device according to claim 1, wherein the plurality of sub pixels includes a red sub pixel, a green sub pixel, and a blue sub pixel, and wherein first lenses of the red sub pixel, the green sub pixel, and the blue sub pixel are disposed to be parallel, and wherein second lenses of the red sub pixel, the green sub pixel, and the blue sub pixel are disposed to be parallel.

9. The light emitting display device according to claim 8, wherein a first lens of a blue sub pixel located in one pixel is coupled to a first lens of the blue sub pixel located in another pixel adjacent in the first direction, and a second lens of a blue sub pixel located in one pixel is coupled to a second lens of the blue sub pixel located in another pixel adjacent in the second direction.

10. The light emitting display device according to claim 9, wherein the first lens and the second lens are coupled to each other to have a mesh pattern.

11. The light emitting display device according to claim 1, wherein a narrow field of view mode and a wide field of view mode are selectively driven, wherein in the wide field-of-view mode, both the first light emitting diode and the second light emitting diode emit light, and wherein in the narrow field-of-view mode, only any one of the first light emitting diode and the second light emitting diode emit light.

12. The light emitting display device according to claim 11, wherein when a narrow field-of-view mode and a wide field-of-view mode are selectively driven and the display panel is disposed vertically, wherein in the wide field-of-view mode, both the first light emitting diode and the second light emitting diode emit light, and wherein in the narrow field-of-view mode, only the second light emitting diode emits light.

13. The light emitting display device according to claim 11, wherein when a narrow field-of-view mode and a wide field-of-view mode are selectively driven and the display panel is disposed horizontally, wherein in the wide field-of-view mode, both the first light emitting diode and the second light emitting diode emit light, and wherein in the narrow field-of-view mode, only the first light emitting diode emits light.

14. The light emitting display device according to claim 1, further comprising:

a data driver circuit configured to supply a data signal to the display panel;

a gate driver circuit configured to supply a gate signal to the display panel;

a timing controller configured to control the data driver circuit and the gate driver circuit; and a gyroscopic sensor configured to sense an orientation direction of the display panel.

15. The light emitting display device according to claim 14, wherein the gyroscopic sensor supplies a signal for the orientation direction of the display panel to the timing controller and the timing controller controls an emission signal which is applied to the pixel circuit of each of the plurality of sub pixels according to the orientation direction of the light emitting display device, based on a signal transmitted from the gyroscopic sensor.

16. The light emitting display device according to claim 1, wherein the first direction and the second direction are perpendicular to each other.

17. A light emitting display device, comprising:

a display panel including a plurality of pixels, each of the plurality of pixels including a plurality of sub pixels, wherein each of the plurality of sub pixels includes:

a first light emitting diode including a first light emitting unit which extends in a first direction;

a first lens which is disposed on the first light emitting diode and refracts light from the first light emitting diode;

a second light emitting diode including a second light emitting unit which extends in a second direction transverse to the first direction; and a second lens which is disposed on the second light emitting diode and refracts light from the second light emitting diode, wherein a narrow field of view mode and a wide field of view mode are selectively driven, wherein in the wide field-of-view mode, both the first light emitting diode and the second light emitting diode emit light, and wherein in the narrow field-of-view mode, only any one of the first light emitting diode and the second light emitting diode emit light.

18. The light emitting display device according to claim 17, wherein when a narrow field-of-view mode and a wide field-of-view mode are selectively driven and the display panel is disposed vertically, wherein in the wide field-of-view mode, both the first light emitting diode and the second light emitting diode emit light, and wherein in the narrow field-of-view mode, only the second light emitting diode emits light.

19. The light emitting display device according to claim 17, wherein when a narrow field-of-view mode and a wide field-of-view mode are selectively driven and the display panel is disposed horizontally, wherein in the wide field-of-view mode, both the first light emitting diode and the second light emitting diode emit light, and wherein in the narrow field-of-view mode, only the first light emitting diode emits light.

* * * * *